(12) United States Patent
Aoki

(10) Patent No.: US 6,559,928 B1
(45) Date of Patent: May 6, 2003

(54) SUBSTRATE SUPPORTING APPARATUS, SUBSTRATE TRANSFER APPARATUS AND THE TRANSFER METHOD, METHOD OF HOLDING THE SUBSTRATE, EXPOSURE APPARATUS AND THE METHOD OF MANUFACTURING THE APPARATUS

(75) Inventor: Yasuo Aoki, Yokohama (JP)

(73) Assignee: Nikon Corporation, Tokyo (JP)

( * ) Notice: Subject to any disclaimer, the term of this patent is extended or adjusted under 35 U.S.C. 154(b) by 115 days.

(21) Appl. No.: 09/635,256

(22) Filed: Aug. 9, 2000

Related U.S. Application Data

(63) Continuation of application No. PCT/JP99/00464, filed on Feb. 4, 1999.

(30) Foreign Application Priority Data

Feb. 9, 1998 (JP) ............................................ 10-042835

(51) Int. Cl.[7] ........................ G03B 27/58; G03B 27/42; G03B 27/32
(52) U.S. Cl. .............................. 355/72; 355/53; 355/77
(58) Field of Search .............................. 355/53, 72–76, 355/77; 414/225, 32, 609, 749; 118/719, 728

(56) References Cited

U.S. PATENT DOCUMENTS

| | | | | |
|---|---|---|---|---|
| 4,775,877 A | * | 10/1988 | Kosugi et al. ................ | 355/53 |
| 4,923,054 A | * | 5/1990 | Ohtani et al. ................. | 187/25 |
| 5,528,118 A | | 6/1996 | Lee ........................ | 318/568.17 |
| 5,623,853 A | | 4/1997 | Novak et al. ............ | 74/490.01 |
| 5,874,820 A | | 2/1999 | Lee ............................. | 318/575 |
| 5,989,346 A | * | 11/1999 | Hiroki ........................ | 118/719 |
| 6,217,663 B1 | * | 4/2001 | Inokuchi et al. ............ | 118/728 |
| 6,293,749 B1 | * | 9/2001 | Raaijimakers et al. ...... | 414/609 |

FOREIGN PATENT DOCUMENTS

| | | | |
|---|---|---|---|
| JP | 50-81565 | * | 7/1975 |
| JP | 59-18792 | | 2/1984 |
| JP | 60-96534 | | 5/1985 |
| JP | 62-35627 | | 2/1987 |
| JP | 2-27359 | | 1/1990 |
| JP | 4-87648 | | 7/1992 |
| JP | 5-39104 | | 10/1993 |
| JP | 6-5692 | | 1/1994 |
| JP | 6-204330 | | 7/1994 |
| JP | 6-283398 | | 10/1994 |
| JP | 7-9856 | | 3/1995 |
| JP | 7-283174 | | 10/1995 |
| JP | 08-166475 | | 6/1996 |
| JP | 08-330224 | | 12/1996 |
| JP | 9-22933 | | 1/1997 |
| JP | 09022933 A | * | 1/1997 |

* cited by examiner

*Primary Examiner*—Henry Hung Nguyen
(74) *Attorney, Agent, or Firm*—Oblon, Spivak, McClelland, Maier & Neustadt, P.C.

(57) ABSTRACT

A substrate supporting apparatus and a substrate holder are prepared, the substrate supporting apparatus including an opening portion having a plurality of openings smaller than the substrate and a support portion made up of portions other than the opening portion, and the substrate holder having a housing portion which houses at least a portion of the support portion. The substrate supporting apparatus supporting the substrate is mounted on the holder in a state where at least a portion of the support portion is housed in the housing portion. Accordingly, the substrate and the substrate supporting apparatus are integrally supported by the holder in a state where the substrate directly contacts an upper surface of the holder.

13 Claims, 12 Drawing Sheets

SUBSTRATE SUPPORTING APPARATUS, SUBSTRATE TRANSFER APPARATUS AND THE TRANSFER METHOD, METHOD OF HOLDING THE SUBSTRATE, EXPOSURE APPARATUS AND THE METHOD OF MANUFACTURING THE APPARATUS

CROSS-REFERENCE TO RELATED APPLICATIONS

This is a continuation of International Application PCT/JP99/00464, with an international filing date of Feb. 4, 1999, the entire content of which is hereby incorporated by reference.

BACKGROUND OF THE INVENTION

1. Field of the Invention

The present invention relates to a substrate supporting apparatus, a substrate transfer apparatus and the transfer method, a method of holding the substrate, an exposure apparatus and a method of manufacturing the apparatus. More particularly, the present invention relates to a substrate supporting apparatus suitable for supporting a thin substrate to be used in the manufacturing of liquid crystal display devices or the like and the inspection process thereof, a substrate transfer apparatus for transferring the substrate integrally with the substrate supporting apparatus and the method therefor, a method for holding the substrate on a substrate holder, an exposure apparatus comprising the substrate transfer apparatus, and the method of manufacturing the exposure apparatus.

2. Description of the Related Art

Conventionally, in the process of manufacturing, for example, a liquid crystal display device (generally called a flat panel display device), a variety of apparatus for processing a large-sized substrate such as exposure apparatus or inspection apparatus have been used. In the exposure and inspection processes using these processing apparatus, a substrate exchanging apparatus (substrate exchanging system) which automatically sets a large-sized substrate (a glass plate) onto the processing apparatus and then removes it from the processing apparatus have been employed.

FIG. 11 is a schematic view of the configuration of a substrate exchanging system employed in an exposure apparatus for liquid crystal display substrates, as an example. In the exchanging system shown in FIG. 11, a substrate P (hereinafter also referred to as plate P) is mounted onto a substrate holder 143 in the following method:

$\hat{1}$ The substrate P is held from underneath by a robot arm 142 and the substrate P is transferred above the substrate holder 143.

$\hat{2}$ In this state, a plurality of supporting bars 144 which are arranged on the substrate holder 143 for loading and unloading a substrate, are arranged via openings on the upper surface of the substrate holder 143. The support bars 144 rise above the upper surface of the substrate holder 143 to hold up the substrate P from underneath (or the robot arm 142 may be lowered to mount the substrate P on the support bars 144 that are already positioned above the upper surface of the substrate holder 143). In such cases, the support bars 144 are arranged to support the substrate P in and around the center, to prevent the substrate P from bending significantly.

$\hat{3}$ When the support bars 144 rise a predetermined amount, the substrate P is lifted a predetermined amount from above the upper surface of the robot arm 142 by the support bars 144. The robot arm 142 then is withdrawn from underneath the substrate P so as not to contact any of the substrate P, the support bars 144, and substrate holder 143. FIG. 12 shows the robot arm 142, which has completed the withdrawal from the substrate holder 143.

$\hat{4}$ The support bars 144 are then lowered, with the substrate P being supported from underneath. The support bars 144 are lowered beneath the upper surface of the substrate holder 143, and only the substrate P is in contact with the substrate holder 143, being mounted on the upper surface. The substrate P is fixed onto the substrate holder 143 by suction through a number of suction holes (not shown) provided on the upper surface of the substrate holder 143. The suction of the substrate P performed evenly, so as to improve the smoothness (flatness) of the substrate P. The substrate holder 143 moves with the substrate P, and thus exposure for liquid crystal display substrates is performed.

The removal of the substrate P from the substrate holder 143 is performed by the reversed procedures of $\hat{1}$–$\hat{4}$.

The substrate used for manufacturing flat panel display devices is a thin glass substrate, for example, 500 mm×600 mm with a thickness of 0.7 mm. This substrate can be easily damaged, even by a significant flexure. In the conventional substrate exchanging system as described above, to load the thin substrate without any damage, it has been necessary to exchange the substrate with the lower surface being evenly supported by a plurality of supporting bars. The supporting bars were arranged in and around the center of the substrate, where they did not come into direct contact with the transfer arm.

To ensure the stability of supporting the substrate, the number of supporting bars needed to be increased. This required more holes on the substrate holder in accordance with the number of the support bars, which results in depriving the substrate holder of maintaining the flatness required to support the substrate in close contact. The supporting bars, therefore, cannot be excessively increased. An increase in the number of the supporting bars also has caused the vertical movement mechanism of the supporting bars to become complicated and large-sized, which deteriorates the position controllability of the substrate holder.

The number of supporting bars had to be limited for the reasons described above, thus creating a flexure to some extent on the substrate. The flexure has kept the overall substrate from being in total contact with, and being removed from the substrate holder simultaneously, resulting in an unfavorable phenomenon that the upper surface of the substrate holder partially wears away.

In the conventional substrate exchanging system, the robot arm had a comb-shaped cantilever structure, the comb teeth facing the movement direction, arranged so as not to interfere with the supporting bars (refer to FIG. 12), the substrate being supported in and around the center to prevent damage. The supporting bars had to lift the substrate high enough to allow the robot arm to be inserted in between the substrate and the holder. With exposure apparatus for liquid crystal display substrates, however, the space between the projection optical system (reference symbol PL in FIGS. 11 and 12) and the substrate holder (generally referred to as a working distance) has become smaller as the numerical aperture of the projection optical system increased. Thus, ensuring a working distance large enough for the robot arm to be inserted has become difficult. Some exposure apparatus for liquid crystal display substrates, therefore, are obliged to perform loading and unloading after the substrate holder has been moved apart from the projection optical system. This requires a larger movement stroke for the substrate holder, increasing the time for loading and unloading the substrate, and also increasing the size of foot print (the area covered by the exposure apparatus installed).

Glass substrates are yet becoming larger and larger, and in the near future, are said to become as large as 1 m×1 m. Larger substrates would obviously be a disadvantage with the conventional substrate exchanging system that has the problems described above still to be solved. Accordingly, it is an urgent task to develop a new technique to comply with the enlargement of such substrates.

SUMMARY OF THE INVENTION

The present invention was developed in view of such circumstances. A first object of the present invention is to provide a substrate supporting apparatus that can effectively prevent a substrate from being flexed, while being exchanged and transferred.

A second object of the present invention is to provide a substrate transfer apparatus which substrate holder does not require a complicated and heavy vertical movement mechanism. The transfer apparatus can also transfer a substrate safely without damaging the substrate, and without deteriorating the flatness of the substrate holder surface even when the space available on the substrate mount surface area of the substrate holder is small.

A third object of the present invention is to provide an exposure apparatus that allows the exchange of a substrate directly under the projection optical system even when the projection optical system has a large numerical aperture.

A fourth object of the present invention is to provide a substrate holding method by a substrate holder for large-sized substrates, without damaging the substrate.

According to a first aspect, the present invention is a substrate supporting apparatus to be transferred with a substrate by a transfer member, comprising a supporting portion provided with a plurality of openings smaller than the substrate, the opening with a shape geometrically closed, the supporting portion supporting the substrate.

The substrate supporting apparatus comprises a supporting portion which has a plurality of openings smaller than the substrate with a geometrically closed shape, so the supporting portion is not flexed or damaged, when affected by an external force on supporting the substrate. Thus, a decrease in the supporting force of the supporting portion caused by flexure or damage can be prevented, so that the substrate cannot be dropped so easily during transfer. In addition, the substrate supporting apparatus is structured to support the substrate surface with lines or planes on the edges or the area peripheral to the geometrically closed opening portions, instead of points. Accordingly, when the transfer member transfers or exchanges the substrate integrally with the substrate supporting apparatus, even if the substrate size becomes large, flexure and damage caused by the flexure can be effectively prevented during the transferring and exchanging.

In this case, the substrate supporting apparatus may comprise a plurality of openings. In the case of comprising a plurality of openings, at least a part of the supporting portion can be made of a plate-shaped porous member.

Various configurations may be employed as the supporting portion in the substrate supporting apparatus according to the present invention. For example, the supporting portion can be formed of combining a plurality of linear members. In this case, the supporting portion can be grid-shaped, or honeycomb-shaped.

The substrate supporting apparatus according to the present invention can further comprise a misplacement preventing portion which prevents the substrate supported by the supporting portion from being misplaced. In this case, the misplacement preventing portion may comprise a level-differential portion forming a boundary, between the supporting portion and the outer portion thereof, or stoppers arranged at a boundary between said supporting portion and the outer portion thereof.

Alternatively, the misplacement preventing portion may be arranged on said supporting portion and is a substrate holding mechanism for clasping/releasing both edges of the substrate depending on the weight of the substrate supporting apparatus. In such a case, the substrate holding mechanism can clasp the substrate and release it without utilizing external force.

In this case, the substrate holding mechanism can comprise at least one link mechanism, and an elastic member which gives force to a part of one link constituting the link mechanism on an edge of the substrate. In this case, at least one link mechanism can be arranged respectively on one edge and the other edge (on the opposite side) of the supporting portion of the substrate supporting apparatus. Then, part of the link constituting each link mechanism can be pressured toward one side or the other side of the edges of the substrate by elastic members to press the substrate from both sides thereof by the link mechanisms. Alternatively, the link mechanism can be arranged on only one edge of the supporting portion of the substrate supporting apparatus. A positioning member such as a stopper can be arranged on the other edge, so that the substrate can then be pressured from both sides, by the link mechanism and the positioning member. In either case, when the weight of the substrate supporting apparatus works on the link mechanism, it releases the pressure on the edge of the substrate against the pressuring force caused by the pressuring member of the link mechanism.

As the link mechanism described above, various link mechanisms may be employed. For example, the link mechanism can be a type of mechanism for performing the Scott Russell parallel motion. Employing such a link mechanism allows a pressuring force substantially vertical to the edge of the substrate.

In the substrate supporting apparatus according to the present invention, the transfer member, as a matter of course, can hold an area near the supporting portion of the substrate supporting apparatus to transfer the substrate supporting apparatus integrally with the substrate. The substrate supporting apparatus may further comprise at least two collar portions, which are integrally affixed to the supporting portion, the transfer member holding the supporting portion which supports the substrate. In this case, the collar portions are also a part of the supporting portion. That is, the collar portions may support the substrate instead of, or with, the supporting portion. By allowing the collar portions to support the substrate, the substrate supporting apparatus can be reduced in weight, as well as reduce the flexure of the substrate.

The substrate supporting apparatus according to the present invention can comprise spacer members, being a part of the supporting portion and disposed partially on a surface side which comes into direct contact with the substrate, the spacer members directly contacting the substrate and preventing the substrate from coming into contact with other portions of the substrate supporting apparatus. In such a case, since the spacer members prevent the substrate from being in contact with other portions, even in the case where the substrate is a glass substrate and the substrate supporting apparatus is made of metal, the substrate can be prevented from being damaged.

According to a second aspect, the present invention is a first substrate transfer apparatus for transferring a substrate, comprising a substrate supporting apparatus for supporting the substrate, a transfer member for holding and transferring the substrate supporting apparatus supporting the substrate, and a positioning mechanism, disposed between the substrate supporting apparatus and the transfer member, the mechanism setting a predetermined positional relationship between the substrate supporting apparatus and the transfer member.

The substrate transfer apparatus comprises a positioning mechanism, arranged between the substrate supporting apparatus and the transfer member, for setting a predetermined positional relationship between the two. Accordingly, a vacuuming mechanism for fixing the substrate supporting apparatus by vacuum to the transfer member, for example, a vacuum chucking and driving source is not required. Moreover, the transfer member and the substrate supporting apparatus can be set to the predetermined positional relationship.

In this case, the configuration of the substrate supporting apparatus is not specified in particular, however, for example, the substrate supporting apparatus which comprises a supporting portion provided with a plurality of openings smaller than the substrate, the opening with a shape geometrically closed, the supporting portion supporting the substrate may be employed.

In the first substrate transfer apparatus according to the present invention, the positioning mechanism includes at least two sets of positioning units, a set of positioning unit comprising a projected portion provided on one of the substrate supporting apparatus and the transfer member, and a recessed portion fitting with the projected portion provided on an other of the substrate supporting apparatus and the transfer member. In such a case, the configuration of the positioning between the substrate supporting apparatus and the transfer member can be simplified. In this case, it is preferable that the projected portion constituting each of the positioning units have a spherical surface and at least one of the recessed portions into which each of the projected portions is fitted is a conical groove, or the projected portion constituting each of the positioning units have a spherical surface and at least two of the recessed portions into which each of the projected portions are fitted are V-grooves each arranged in different directions. In the former case, the positioning units having the conical groove as a recessed portion can prevent the substrate supporting apparatus from moving in two-dimensional directions relative to the transfer member, and all the positioning units prevent the substrate supporting apparatus and the transfer apparatus from rotating. In the latter case, the two positioning units having V-grooves directed in different directions as recessed portions can prevent the substrate supporting apparatus from moving in the two-dimensional direction relative to the transfer member, as well as prevent the relative rotation of both apparatus.

The projected portions described above, having a spherical surface can be a part of a ball member.

In the first substrate transfer apparatus according to the present invention, the transfer member can be of any kind so long as it can support the substrate supporting apparatus holding the substrate and transfer them, such as a robot arm.

According to a third aspect, the present invention is a second substrate transfer apparatus for transferring a substrate, comprising a substrate supporting apparatus for supporting the substrate, a transfer member for holding and transferring the substrate supporting apparatus supporting the substrate, a substrate holder onto which the substrate supporting apparatus is mounted, and a positioning mechanism which is disposed between the substrate supporting apparatus and the substrate holder, the mechanism setting a predetermined positional relationship between the substrate supporting apparatus and the substrate holder.

The substrate transfer apparatus comprises a positioning mechanism, arranged between the substrate supporting apparatus and the substrate holder, for setting a predetermined positional relationship between the two. Accordingly, the substrate holder only requires a mechanism for vacuuming the substrate, and the substrate holder can be moved with the substrate supporting apparatus being mounted on the substrate holder, without a mechanism for vacuum chucking and fixing the substrate supporting apparatus.

In this case, the configuration of the substrate supporting apparatus is not specified in particular. However, for example, the substrate supporting apparatus which comprises a supporting portion provided with a plurality of openings smaller than the substrate, the opening with a shape geometrically closed, the supporting portion supporting the substrate, may be employed.

In the second substrate transfer apparatus according to the present invention, it is preferable that the substrate holder is provided with groove portions into which an entire contact portion of the substrate supported by the supporting apparatus is fitted deeply, the contact portion being fitted below a substrate mounting surface of the substrate holder. In such a case, when the substrate supporting apparatus which supports the substrate is mounted on the substrate holder, the substrate supporting apparatus fits into the groove portions of the substrate holder deeply, and the whole portion in contact with the substrate is positioned below the substrate mount surface of the substrate holder. Thus, the substrate can be fixed to the substrate holder by vacuum without any problem.

In the second substrate transfer apparatus according to the present invention, the positioning mechanism includes at least two sets of positioning units, a set of positioning unit comprising a projected portion provided on one of the substrate supporting apparatus and the substrate holder, and a recessed portion, fitting with the projected portion provided on an other of the substrate supporting apparatus and the substrate holder. In such a case, the configuration of the positioning between the substrate supporting apparatus and the substrate holder can be simplified. In this case, it is preferable that the projected portion constituting each of the positioning units have a spherical surface and at least one of the recessed portions into which each of the projected portions are fitted is a conical groove, or, the projected portion constituting each of the positioning units have a spherical surface and at least two of the recessed portions into which each of the projected portions are fitted are V-grooves each arranged in different directions. In the former case, the positioning units having the conical groove as a recessed portion can prevent the substrate supporting apparatus from moving in two-dimensional directions relative to the substrate holder, and all the positioning units prevent the substrate supporting apparatus and substrate holder from rotating. In the latter case, the two positioning units having V-grooves directed in different directions as recessed portions can prevent the substrate supporting apparatus from moving in the two-dimensional direction relative to the substrate holder, as well as prevent the relative rotation for both apparatus.

The projected portions having a spherical surface can be a part of a ball member.

According to a fourth aspect, the present invention is a third substrate transfer apparatus comprising a substrate holder provided with groove portions into which a supporting portion of a substrate supporting apparatus fits, a first transfer mechanism for transferring the substrate supporting apparatus supporting the substrate above the substrate holder, and a second transfer mechanism for moving relatively the substrate supporting apparatus and the substrate holder, in a direction perpendicular to a surface of the substrate holder to fit the supporting portion into the groove portions, the surface being a mounting surface of the substrate on the substrate holder.

According to this aspect, the first transfer mechanism transfers the substrate supporting apparatus integrally with the substrate, above the substrate holder. The second transfer mechanism, then, relatively moves the substrate supporting apparatus and the substrate holder in a direction perpendicular to the mounting surface of the substrate holder, thus allowing the supporting portion to fit into the groove portions. This brings the upper surface of the holder into direct contact with the substrate, therefore, allowing the substrate holder to vacuum and hold the substrate via the opening portions of the substrate supporting apparatus. In this case, a complicated and heavy vertical movement mechanism is not necessary on the substrate holder. The evenness of the holder surface can also be maintained, and even when only a narrow space is available around the substrate mount surface of the substrate holder, the substrate can be safely and swiftly transferred without being damaged.

The third substrate transfer apparatus according to the present invention can further comprise a third transfer mechanism for releasing the fitting between the supporting portion and the groove portions, and withdrawing the substrate supporting apparatus supporting the substrate from above the substrate holder. In such a case, when the substrate supporting apparatus placed on the substrate holder as described above is removed, the third transfer mechanism releases the fitting between the supporting portion and the groove portions, so that the substrate supporting apparatus holding the substrate is withdrawn from above the substrate holder. That is, according to this description, the substrate holder does not require a complicated and heavy vertical movement mechanism. The evenness of the holder surface can also be maintained, and even when only a narrow space is available around the substrate mount surface of the substrate holder, the substrate can be safely and swiftly transferred without being damaged. In addition, compared with the conventional substrate exchanging system described previously, the number of steps required to exchange the substrate can be greatly reduced, allowing the throughput to be improved from the respect of time consuming, since the time required for exchanging the substrate is reduced.

In this case, as a matter of course, the first to third transfer mechanisms may respectively have individual transfer arms for transferring supporting members, and alternatively, the first to third transfer mechanisms may have a common transfer arm for transferring the substrate supporting apparatus. In such a case, the number of parts can be reduced, allowing cost reduction.

According to a fifth aspect, the present invention is a method for holding a substrate on a substrate holder, wherein the substrate holder integrally holds the substrate and the substrate supporting apparatus, the substrate holder having a housing portion formed which houses at least a portion of the substrate supporting apparatus. In this method, the substrate holder, which has a housing portion to house at least a portion of the substrate supporting apparatus integrally holds the substrate and the substrate supporting apparatus. Therefore, sufficient stiffness is provided to the substrate supporting apparatus, preventing flexure or the like during the transfer of the substrate, while the substrate and the substrate supporting apparatus are held on the substrate holder. This allows larger substrates to be held on a substrate holder, without the substrate being damaged.

In this case, the housing portion can have groove portions to house the substrate supporting apparatus. In such a case, the substrate supporting apparatus fits into the groove portions on the substrate holder, allowing the substrate to be held in direct contact with the upper surface of the substrate holder.

In the substrate transfer method according to the present invention, the substrate can be suctioned after the substrate and the substrate supporting apparatus are integrally held by the substrate holder.

According to a sixth aspect, the present invention is a first exposure apparatus for transferring a predetermined pattern onto a substrate by exposing the substrate with an energy beam, the exposure apparatus comprising a substrate supporting apparatus for supporting the substrate, a transfer member for holding and transferring the substrate supporting apparatus supporting the substrate, a substrate holder onto which the substrate supporting apparatus is mounted, a positioning mechanism, disposed between the substrate supporting apparatus and the substrate holder, for setting a predetermined positional relationship between the substrate supporting apparatus and the substrate holder, and a substrate stage integrally moving in a predetermined direction with the substrate holder.

With the first exposure apparatus, the transfer member holds and transfers the substrate supporting apparatus supporting the substrate, and mounts the substrate supporting apparatus on the substrate holder. Once it is mounted, the positional relationship between the substrate supporting apparatus and the substrate holder is set to a predetermined positional relationship by the positioning mechanism. Then, during exposure, the substrate stage integrally moves in a predetermined direction with the substrate holder. That is, a positioning mechanism is arranged between the substrate supporting apparatus and the substrate holder for setting a predetermined positional relationship between the two, and the substrate holder, therefore, only require a mechanism for vacuuming the substrate. Even if vacuum chucking or the like to keep the substrate supporting apparatus fixed is not arranged, the substrate stage can be integrally moved with the substrate holder, and for example, can be moved integrally to expose a plurality of regions on the substrate.

In this case, the first exposure apparatus can be further comprise a mask stage for supporting a mask on which the pattern is formed, and a projection optical system for projecting an energy beam deflected from the mask onto the substrate. This means that the first exposure apparatus related to the present invention can be configured as a projection exposure apparatus.

In the first exposure apparatus according to the present invention, the substrate supporting apparatus can comprise a supporting portion provided with a plurality of openings smaller than the substrate, the opening with a shape geometrically closed, the supporting portion supporting the substrate, the supporting apparatus held by the transfer member.

According to a seventh aspect, the present invention is a second exposure apparatus for transferring a predetermined pattern onto a substrate by exposing the substrate with an energy beam, the exposure apparatus comprising a substrate holder provided with groove portions into which a supporting portion of a substrate supporting apparatus related to the present invention fits, a first transfer mechanism for transferring the substrate supporting apparatus above the substrate holder, by holding a holding portion, a second transfer mechanism for moving relatively the substrate supporting apparatus and the substrate holder, in a direction perpendicular to a surface of the substrate holder to fit the supporting portion into the groove portions, and a substrate stage integrally moving in a predetermined direction with the substrate holder.

With the second exposure apparatus, the first transfer mechanism integrally transfers the substrate supporting apparatus above the substrate holder with the substrate. Then, the second transfer mechanism relatively moves the substrate supporting apparatus and the substrate holder in a direction perpendicular to the mounting surface of the substrate holder, thus allowing the supporting portion to fit into the groove portions. Thus, the upper surface of the holder comes directly into contact with the substrate and therefore, the substrate holder can vacuum and hold the substrate via the opening portions of the substrate supporting apparatus. Then, the substrate stage is integrally moved in a predetermined direction with the substrate holder, thus performing exposure. Accordingly, a complicated and heavy vertical movement mechanism is not necessary on the substrate holder. The evenness of the holder surface can also be maintained, and even when only a narrow space is available around the substrate mount surface of the substrate holder, the substrate can be safely and swiftly transferred without being damaged.

The second exposure apparatus according to the present invention can further comprise a mask stage for supporting a mask on which the pattern is formed, and a projection optical system for projecting an energy beam deflected from the mask onto the substrate. That is, the second exposure apparatus according to the present invention can be configured as a projection exposure apparatus.

The second exposure apparatus according to the present invention can further comprise a third transfer mechanism for releasing the fitting between the supporting portion and the groove portions, and withdrawing the substrate supporting apparatus holding the substrate from above the substrate holder. In such a case, when the substrate supporting apparatus placed on the substrate holder is detached, the third transfer mechanism releases the fitting between the supporting portion and the groove portions, so that the substrate supporting apparatus holding the substrate is retracted from above the substrate holder. That is, with this exposure apparatus, even when only a narrow space is available around the substrate mount surface of the substrate holder, the substrate can be safely and swiftly transferred without being damaged. In addition, compared with the conventional substrate exchanging system described previously, the number of steps required to exchange the substrate can be greatly reduced, allowing the throughput to be improved from the respect of time consuming, since the time required for exchanging the substrate is reduced. In particular, with the projection exposure apparatus, even if the projection optical system, arranged at the side of the substrate mount surface of the substrate holder, has a large numerical aperture (N.A.), the substrate can be effectively exchanged at the position of the projection optical system. The substrate holder, therefore, does not have to be moved apart from the projection optical system to exchange the substrate and accordingly the movement stroke of the substrate holder can be reduced. This shortens the time for loading and unloading the substrate, improving the throughput, and also allows the foot print (the area covered by the exposure apparatus installed) to decrease in size.

In the second exposure apparatus according to the present invention, the first to third transfer mechanisms have a common transfer arm for transferring the substrate supporting apparatus with the substrate supporting apparatus being held. In such a case, cost can be reduced by the reduction of the number of parts.

According to an eighth aspect, the present invention is a manufacturing method for manufacturing an exposure apparatus for use in a lithographic process of manufacturing micro devices, comprising the steps of providing a substrate supporting apparatus for supporting a substrate, providing a transfer member for holding and transferring the substrate supporting apparatus supporting the substrate, providing a substrate holder onto which the substrate supporting apparatus is mounted, providing a positioning mechanism in between the substrate supporting apparatus and the substrate holder for setting a predetermined positional relationship between the substrate supporting apparatus and the substrate holder, and mounting the substrate holder onto a substrate stage moving in a predetermined direction.

With this method, the substrate supporting apparatus for supporting a substrate is prepared, and a transfer member is installed for transferring the substrate supporting apparatus together with the substrate. At this timing, the substrate stage and other various parts are incorporated into the exposure apparatus. The substrate holder is prepared and incorporated into the substrate stage. With the incorporation, the positioning mechanism is also installed between the substrate supporting apparatus and the substrate holder. Then, the parts mentioned above that are incorporated into the exposure apparatus, are combined mechanically, optically, and electrically and then adjusted. Thus, the exposure apparatus according to the present invention can be manufactured.

In this case, the method can further comprise the steps of providing a mask stage for holding a mask on which a pattern to be transferred onto the substrate is formed, and providing a projection optical system for projecting the mask pattern onto the substrate. In such a case, a projection exposure apparatus based on the step and repeat method or step and scan method, can be manufactured.

According to a ninth aspect, the present invention is a fourth substrate transfer apparatus for loading a substrate onto a substrate mount surface on which the substrate is mounted for processing, the transfer apparatus comprising a substrate supporting apparatus capable of being in a substrate supporting state, and of being in a non-supporting state by freeing the supporting state, and a loading member capable of being in an engaged state with the substrate supporting apparatus, and of being in a non-engaged state by freeing the engaged state, wherein the loading member moves to free itself from the engaged state upon loading of the substrate, while the substrate supporting apparatus moves to free itself from the supporting state in accordance with the loading member movement, and the substrate is mounted onto the substrate mount surface.

With the fourth substrate transfer apparatus, when the substrate is loaded onto the substrate mount surface, the loading member changes from the engaged state in which the loading member engages the substrate supporting apparatus in a supporting state, to the non-engaged state in which this engagement is freed. Following this operation, the substrate supporting apparatus changes from the supporting state to the non-supporting state by freeing the substrate supporting state, thereby loading the substrate onto the substrate mount surface. Accordingly, the substrate can be loaded onto the substrate mount surface without using an interim loading/unloading mechanism with the conventional supporting bars (refer to FIG. 11). The substrate can also be processed without withdrawing the substrate supporting apparatus after the substrate has been loaded on the substrate mount surface together with the substrate supporting apparatus.

The fourth substrate transfer apparatus according to the present invention may further comprise an unloading member capable of being in a engaged state with the substrate supporting apparatus, and of being in a non-engaged state by freeing the engaged state, wherein the unloading member moves from the non-engaged state to engage itself with the substrate supporting apparatus upon unloading of the substrate and further moves in a predetermined direction, while the substrate supporting apparatus moves into a supporting state supporting the substrate in accordance with the unloading member movement, the substrate being detached from the substrate mount surface. In such a case, when the substrate is unloaded from the substrate mount surface, the unloading member engages itself with the substrate supporting apparatus which is in a non-supporting state, to change from the non-engaged state to the engaged state, and thereafter moves in the predetermined direction. Then, following the movement of the unloading member, the substrate supporting apparatus changes from the non-supporting state to the supporting state in which the substrate is supported and thus the substrate can be detached from the substrate mount surface. Accordingly, the loading/unloading of the substrate onto/from the substrate mount surface, that is, to exchange the substrate without using an interim loading/unloading mechanism with the conventional supporting bars (refer to FIG. 11).

The fourth substrate transfer apparatus according to the present invention can further comprises a housing member, provided adjacent to the substrate mount surface, for housing the substrate supporting apparatus after the loading, the apparatus not engaged with the loading member. In such a case, the substrate supporting apparatus, which is in the non-engaged state, can be housed by the housing member after the substrate has been loaded onto the substrate mount surface. Accordingly, for example, in the case where the substrate mount surface is arranged on the substrate holder, the substrate holder can be moved immediately after the substrate has been loaded.

The fourth substrate transfer apparatus according to the present invention, can further comprise a misplacement preventing portion for preventing the substrate from being misplaced with the substrate supporting apparatus being in the supporting state. Alternatively, the fourth substrate transfer apparatus may further comprise a positioning mechanism capable of assuming a positioning mechanism, being in a positioning state in which the substrate is positioned in respect to the substrate supporting apparatus by pressuring at least one edge of the substrate, and can be in a non-positioned state in which the substrate is freed from the pressure, wherein the positioning mechanism moves from the positioned state to the non-positioned state upon the loading of the substrate, while the substrate is mounted onto the substrate mount surface.

In the fourth substrate transfer apparatus according to the present invention, as a matter of course, the loading member may be different from the unloading member. However, the loading member and the unloading member may be the same. In such a case, cost reduction is possible by reducing the number of parts.

According to a tenth aspect, the present invention is a fifth substrate transfer apparatus for unloading a substrate mounted on a substrate mount surface, comprising a substrate supporting apparatus capable of being in a supporting state, and of being in a non-supporting state by freeing the substrate, and an unloading member capable of being in an engaged state with the substrate supporting apparatus, and of being in a non-engaged state by freeing the engagement state, wherein the unloading member moves from the non-engaged state to engage itself with the substrate supporting apparatus upon unloading of the substrate and further moves in a predetermined direction, while the substrate supporting apparatus moves into the supporting state according to the unloading member movement, the substrate being detached from the substrate mount surface.

With the fifth substrate transfer apparatus, upon unloading the substrate from the substrate mount surface, the unloading member changes from the non-engaged state to engage itself with the substrate supporting apparatus, and then moves in a predetermined direction. Meanwhile, the substrate supporting apparatus changes from the non-supporting state to the supporting state according to the unloading member movement, to detach the substrate from the substrate mount surface. Accordingly, the unloading of the substrate from the substrate mount surface can be performed without using an interim loading/unloading mechanism with the conventional supporting bars (refer to FIG. 11).

The fifth substrate transfer apparatus according to the present invention can further comprise a housing member, provided adjacent to the substrate mount surface, for housing the substrate supporting apparatus before the unloading, the apparatus not engaged with the unloading member.

According to an eleventh aspect, the present invention is a first substrate transfer method for loading a substrate onto a substrate mount surface on which the substrate is mounted for processing, comprising the steps of preparing a substrate supporting apparatus and a loading member, transferring the substrate supporting apparatus supporting the substrate by the loading member onto the substrate mount surface, and separating the substrate supporting apparatus from the loading member after detaching the substrate from the substrate supporting apparatus, by moving the loading member in a predetermined direction.

With the first method, when the substrate is loaded onto the substrate mount surface, the loading member transfers the substrate supporting apparatus supporting the substrate onto the substrate mount surface, then the loading member moves in the predetermined direction. The substrate is thereby detached from the substrate supporting apparatus supporting the substrate and then the substrate supporting apparatus is detached from the loading member. Thus, the substrate is loaded on the substrate mount surface. Accordingly, the loading of the substrate onto the substrate mount surface can be performed without using an interim loading/unloading mechanism with the conventional supporting bars (refer to FIG. 11). In addition, processing of the substrate becomes possible without withdrawing the substrate supporting apparatus, after the substrate has been loaded on the substrate mount surface together with the substrate supporting apparatus.

The first substrate transfer method according to the present invention can further comprise the step of pressuring at least one edge of the substrate to position the substrate in respect to the substrate supporting apparatus, upon transferring the transfer supporting apparatus onto the substrate mount surface by the loading member. In such a case, the position of the substrate in respect to the substrate supporting apparatus is adjusted while the substrate is being transferred. Therefore, by placing the substrate supporting apparatus supporting the substrate at the predetermined position on the substrate mount surface, consequently, the substrate can be easily mounted at the predetermined position on the substrate mount surface. Accordingly, in the case where the substrate mount surface is arranged on the substrate holder, the positioning of the substrate after the substrate has been placed on the substrate holder is simplified, and sometimes, may not be required.

According to a twelfth aspect, the present invention is a second substrate transfer method for unloading a processed substrate from a substrate mount surface, comprising the steps of preparing a substrate supporting apparatus and an unloading member, engaging the unloading member with the substrate supporting apparatus mounted with the substrate, mounted on the substrate mount surface, and detaching the substrate from the substrate mount surface after the substrate supporting apparatus supports the substrate, by driving the unloading member into a predetermined direction.

With the second method, when the substrate is unloaded from the substrate mount surface, the unloading member engages itself with the substrate supporting apparatus that has been mounted on the substrate mount surface together with the substrate, and thereafter is driven into the predetermined direction. The substrate can thereby be detached from the substrate mount surface after the substrate has been supported by the substrate supporting apparatus. Accordingly, the unloading of the substrate from the substrate mount surface can be performed without using an interim loading/unloading mechanism with the conventional supporting bars (refer to FIG. 11).

DESCRIPTION OF THE PREFERRED EMBODIMENTS

First Embodiment

A first embodiment of the present invention is explained below with reference to FIGS. 1 through 3.

Figure 1:
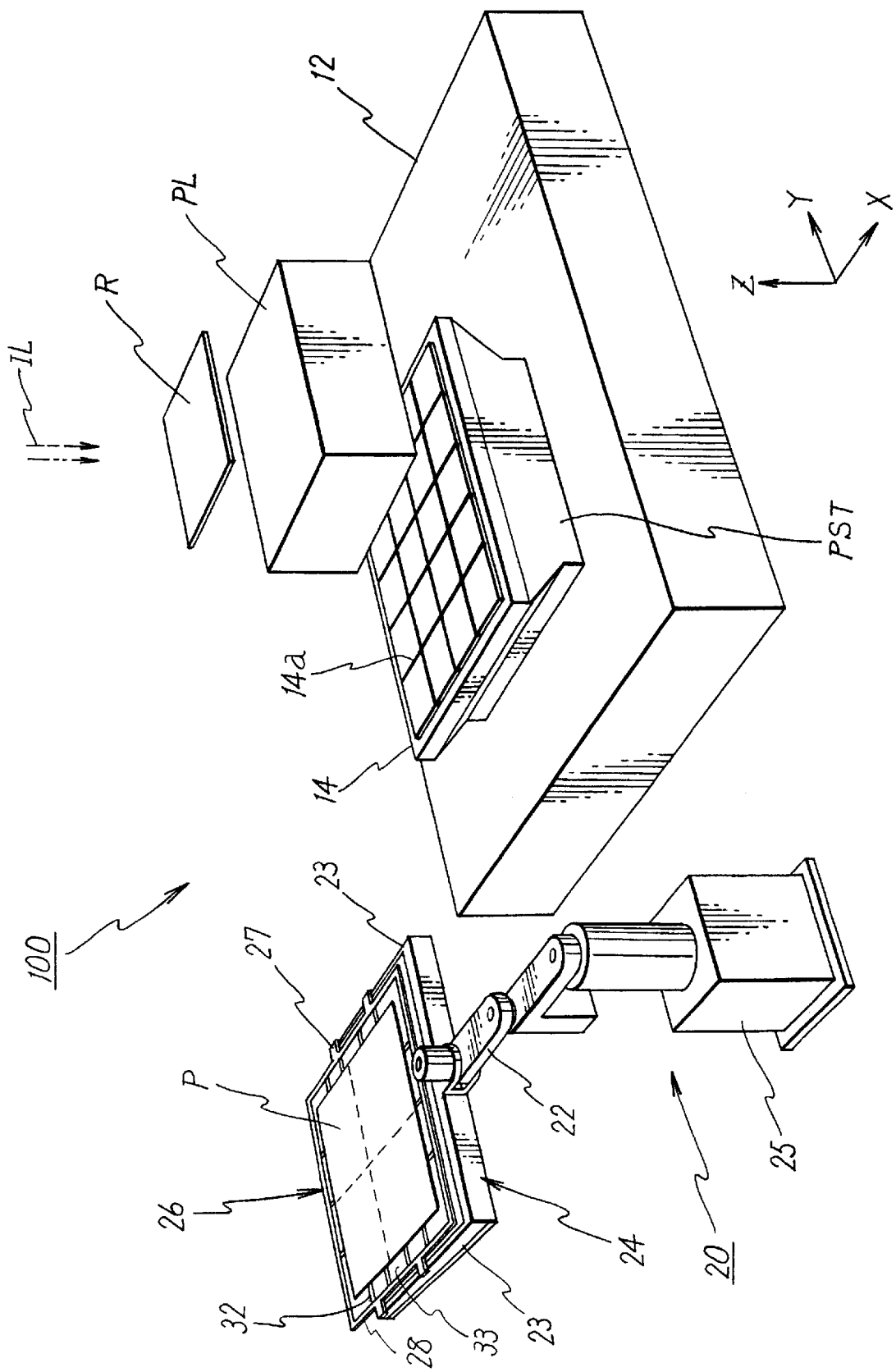
FIG. 1 is a schematic perspective view showing the structure of an exposure apparatus for liquid crystal display substrates, according to a first embodiment of the present invention.
Figure 2:
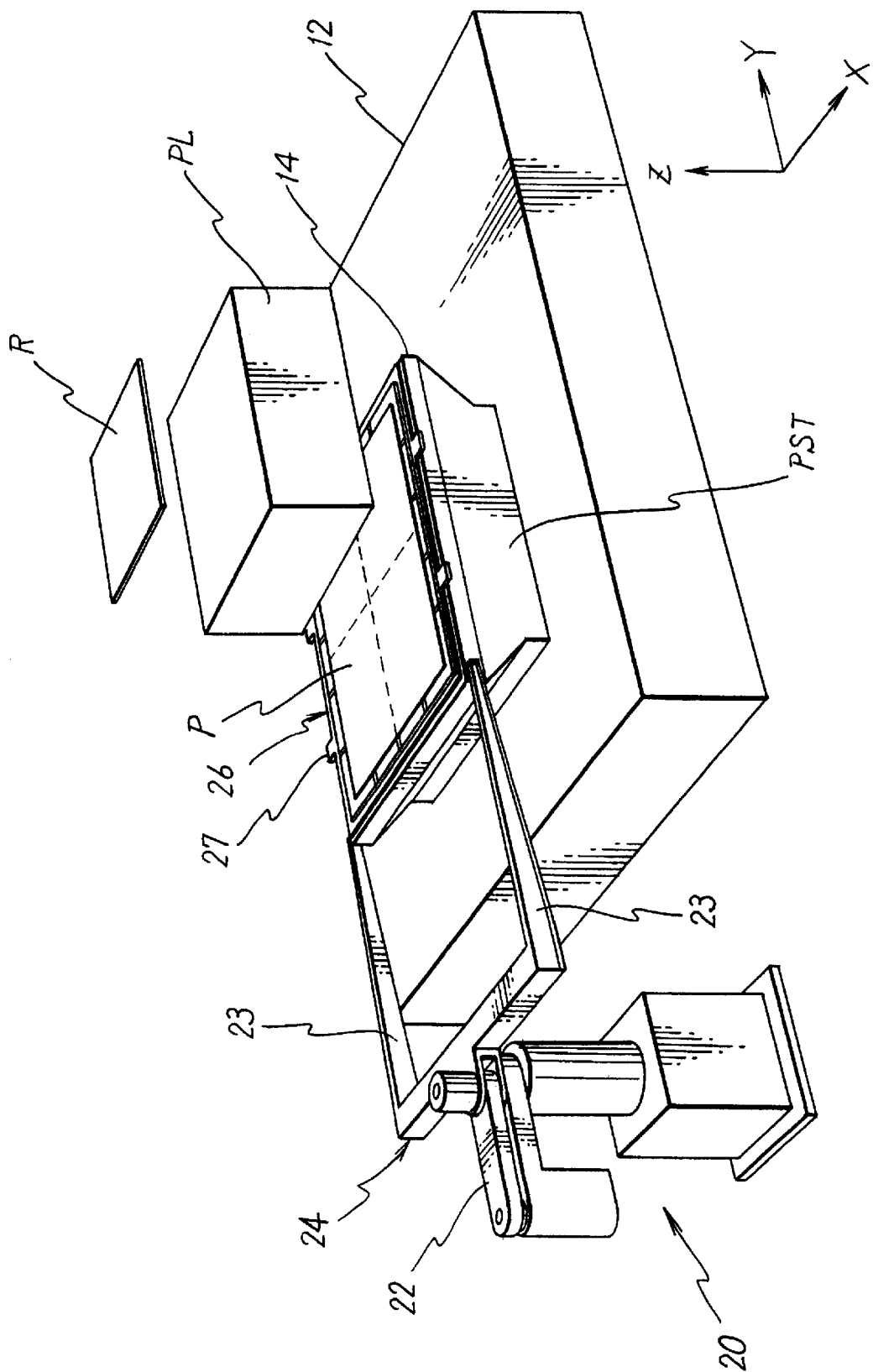
FIG. 2 is an explanatory view showing the operation of the exposure apparatus of FIG. 1.

FIG. 1 is a schematic perspective view showing an exposure apparatus 100 for liquid crystal display substrates which is an exposure apparatus including a substrate transfer apparatus according to the first embodiment.

The exposure apparatus 100 comprises an illumination system (not shown in FIGS.) for illuminating a mask as a reticle R with an exposure illumination light IL (refer to imaginary line arrows IL in FIG. 1), a reticle stage (not shown in Figs.) for supporting the reticle R, a projection optical system PL arranged below the reticle stage, and a plate stage PST as a substrate stage which moves in X-Y two-dimensional directions on a base 12 arranged below the projection optical system PL.

A plate holder 14 (hereinafter referred to as a "holder", as appropriate) as a substrate holder is mounted on the plate stage PST.

As the projection optical system PL, an optical system is employed which projects an erect image with equal magnification. With the exposure apparatus 100, as will be described later, the step and scan method is employed for exposure with a rectangular glass plate (hereinafter referred to as a plate as appropriate) P as a substrate (and a photosensitive substrate) mounted on the holder 14 which in turn is mounted on the plate stage PST, and the pattern formed on the reticle R is sequentially transferred onto a plurality of areas, for example four areas, formed on the plate P. That is, with the exposure apparatus 100, scanning exposure is performed by the illumination system (not shown in Figs.) illuminating the slit-shaped illuminating areas on the reticle R with the illumination light IL (energy beam), while a controller (not shown in Figs.) drives the reticle stage holding the reticle R and the substrate stage PST holding the plate P with holder 14 synchronously in a predetermined scanning direction (Y direction in this case) in the same velocity through a driving system (not shown in Figs.), transferring the pattern of the reticle R onto an area on the plate P step by step. As soon as the scanning exposure of an area is completed, the controller performs stepping movements of a predetermined amount in the X direction, to bring the plate stage PST to a starting position in the next scanning area. The exposure apparatus 100 repeats the scanning exposure and the stepping movements, and sequentially transfers the reticle pattern onto the four areas.

In this embodiment, as the illumination light for exposure, that is, the energy beam IL, far ultraviolet light (DUV) such as a bright line (g line, i line) in the ultraviolet region from a super-high pressure mercury lamp or an excimer laser light from a KrF excimer laser source (an oscillation wavelength of 248 nm), is employed.

In the exposure apparatus 100, as a driving source for the reticle stage and plate stage PST, for example, a linear motor can be used. A detailed construction of a linear motor employed as a stage driving source is disclosed, for example, in U.S. Pat. Nos. 5,623,853, and 5,528,118, which are fully incorporated by reference herein. As a method of stage levitation, either an air levitation method by an air bearing or a magnetic levitation method by the Lorentz force or reactance force maybe employed. The stage may be either of a type to be moved along a guide, or of a guide-less type in which no guide is provided.

The reaction force generated by the movement of the reticle stage during scanning exposure may be released to the floor (ground) using a frame member. This is disclosed, for example, in Japan Laid Open Patent No. 08-330224 and the corresponding U.S. patent application Ser. No. 08/416,558, which are fully incorporated by reference herein.

As for the reaction force generated by the movement of the substrate stage PST, it may be released to the floor (ground) using a frame member as is disclosed, for example, in Japan Laid Open Patent No. 08-166475 and the corresponding U.S. Pat. No. 5,528,118, which are fully incorporated by reference herein.

Furthermore, the exposure apparatus 100 is provided with a horizontal joint-arm robot (a scalar robot) 20. The robot 20 comprises an arm portion 22 including a plurality of parts connected with one another by a vertical articulated shaft. A transfer arm 24 which has two prong portions 23 (refer to FIG. 2), is arranged on the end of the arm portion 22, and the robot 20 also has a driving unit 25 for driving the arm portion 22.

FIG. 1 shows the transfer arm 24 supporting the substrate supporting apparatus 26. The substrate supporting apparatus 26 has a total of four collar portions 27, two on each sides to support the plate P from underneath with the two prong portions 23.

The substrate supporting apparatus 26 comprises a rectangular frame 28, which is one size larger than the plate P, and a plurality of linear members 32 arranged at predetermined intervals in a grid pattern within the inner portion of the frame 28. The grid pattern formed by the linear members 32 has a plurality of rectangular shaped openings 33. The plurality of linear members 32 are welded to one another or combined in a grid pattern, being welded to the frame 28.

Figure 3:
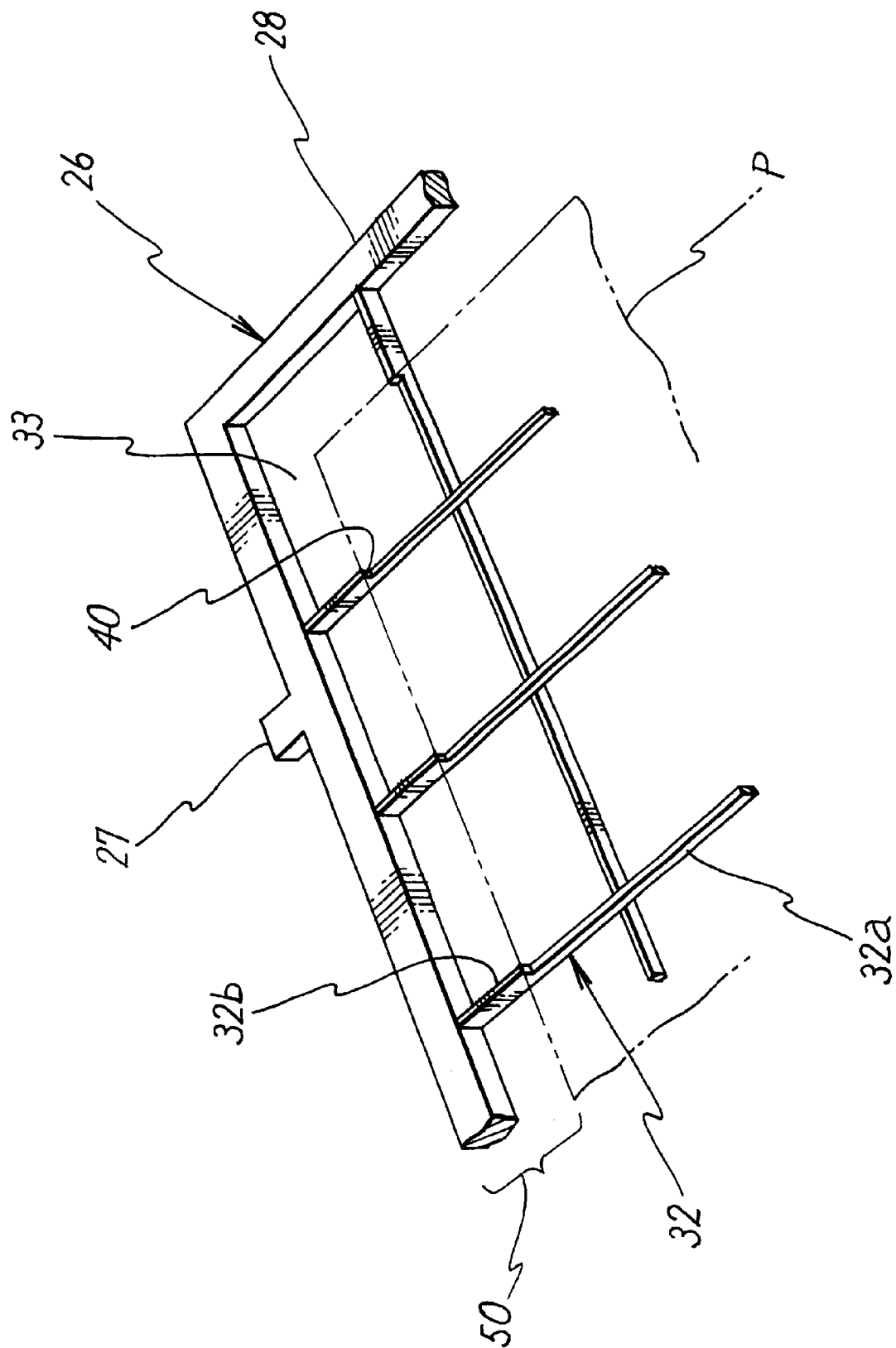
FIG. 3 is an enlarged schematic perspective view, partially showing a substrate supporting apparatus in FIG. 1.

FIG. 3 is a partially enlarged view of the substrate supporting apparatus 26. FIG. 3 shows a level differential portion 40, formed on the ends of each linear member 32 close to the frame 28. The level differential portion 40 is engaged with the outer edges of the plate P, which is one size smaller than the frame 28, and constitute a positioning portion (misplacement preventing portion) to set the plate P in a predetermined position. In this embodiment, the frame 28 and the outer part of the level differential portion 40 (the higher portion), 32*b*, formed on the ends of a plurality of linear members 32, constitute an outer edge portion 50. The inner portion of the level differential portion 40, 32*a*, constitute a supporting portion for supporting the plate P. For the sake of convenience, reference symbol 32*a* is used hereinafter to indicate the supporting portion.

The cross sectional shape and size of each linear members forming the supporting portion 32*a* are not specified in particular, and the cross sectional shape may be circular, rectangular, or an elongated rectangle. The supporting portion 32*a* may be arranged in a grid pattern by the plurality of linear members as described above, welded or adhered, but is not limited thereto and may be integrally formed. The interval of the grid is determined in respect to the size and thickness of the plate P to prevent the plate P from being significantly flexed and damaged.

As described above, the substrate supporting apparatus 26 is formed of combining the frame 28 and the linear members 32 (including integral formation). The apparatus 26 can be made of highly stiff metal such as iron, to make it light-weighted and highly stiff, making quick transferring possible.

The loading/unloading of the plate P to/from the substrate supporting apparatus 26 is performed by a plate loading/unloading apparatus (not shown in Figs.). The plate loading/unloading apparatus, for example, may have a configuration similar to the conventional example previously described, which employs the supporting bars and vertical movement mechanism. As in the example, the plate P is first supported above the substrate supporting apparatus 26, and then moves downward to be mounted on the substrate supporting apparatus 26. The loading/unloading by the apparatus can be performed safely in a spacious place with a number of support bars so that the plate P does not flex.

Referring back to FIG. 1, on the upper surface of the holder 14, grid-shaped grooves 14*a* are formed to fit with the supporting portions 32*a*. The grooves 14*a* are formed deep enough for the supporting portion 32*a* to completely fit into the holder 14. The upper surface of the holder 14 is formed evenly, to eliminate the flexure of the plate P when the plate P is mounted on the holder. The upper surface of the holder 14, further comprises a number of suction holes in respect to the plurality of opening portions 33, for bringing the plate P into intimate contact with the surface. Suction holes are also arranged on the edges on the upper surface of the holder 14, for fixing the lower surface of the frame 28 of the substrate supporting apparatus 26 by vacuum chucking. Each of the suction holes is connected to a vacuum pump (not shown in Figs.) through piping (not shown in Figs.).

The loading operations of the plate P onto the holder 14 by the robot 20 structured as above, is described next.

1̂ The transfer arm 24 is driven through the arm portion 22 by the driving unit 25 to transfer the plate P above the holder 14 integrally with the substrate supporting apparatus 26. The driving unit 25 adjusts the position of the transfer arm 24 so that each of the linear members forming the grid of the supporting portion 32*a* is located exactly above the grooves 14*a* on the holder 14.

2̂ The driving unit 25 then moves the transfer arm 24 downward by a predetermined amount. As a result, each of the linear members forming the grid of the supporting portion 32*a* fit into the grooves 14*a* of the holder 14. The supporting portion 32*a* moves further down, below the upper surface of the holder 14, leaving only the plate P in direct contact with the upper surface of the holder 14. A controller (not shown in Figs.) starts the vacuum chucking through the pumps (not shown in Figs.), and the lower surface of the plate P is fixed by adsorption to the holder 14 through each of the suction holes formed on the holder 14 in respect to the plurality of opening portions 33. A portion of the frame 28 of the substrate supporting apparatus 26 is also fixed by vacuum chucking to the holder 14.

3̂ As soon as the plate P is loaded onto the holder 14, the driving unit 25 withdraws the transfer arm 24 from above the holder 14. FIG. 2 shows the transfer arm 24, which has completed the withdrawal from the holder 14. FIG. 2 also shows the state immediately before the plate P is to be removed from the holder 14.

Next, the operation for unloading the plate P from the holder 14 after exposure has been completed is described.

1̂ After exposure has been completed, the driving unit 25 drives the transfer arm 24, so that the two prong portions 23 which are located on both sides of the holder 14 in the X direction underneath the substrate supporting surface 26, are inserted from one side of the Y direction. The controller (not shown in Figs.) also releases the vacuum chucking by the vacuum pump (not shown in Figs.) upon insertion, and the plate P is released from the holder 14.

2̂ The driving unit 25 then drives the transfer arm 24 upward by a predetermined amount, and the prong portions 23 of the transfer arm 24 comes into contact with the lower surface of the collar portions 27 of the substrate supporting apparatus 26. The transfer arm 24 is driven further upward, and the plate P which is supported via the collar portions 27 by the substrate supporting apparatus 26, is lifted above the holder 14, and the supporting portion 32a is detached from the grooves 14a.

3̂ When the substrate supporting apparatus 26 is lifted to the point where the supporting portion 32a is detached from the grooves 14a, the driving unit 25 drives the transfer arm 24 so that the substrate supporting apparatus 26 supporting the plate P is withdrawn from above the holder 14.

As is obvious from the description above, this embodiment comprises a first transfer mechanism which transfers the substrate supporting apparatus 26 above the holder 14, by supporting the outer portion (the collar portions 27, to be more accurate) with the robot 20. This embodiment further comprises a second transfer mechanism, which relatively moves the substrate supporting apparatus 26 and the holder 14 in a direction perpendicular to the mounting surface of the holder 14 to fit the supporting portion 32a into the grooves 14a. A third transfer mechanism, which detaches the supporting portion 32a from the grooves 14a and withdraws the substrate supporting apparatus 26 from above the holder 14, is also comprised. Accordingly, in this case, the first to third transfer mechanisms employ a common transfer arm 24 which transfers the substrate supporting apparatus 26 by holding the collar portions 27 of the substrate supporting apparatus 26.

Figure 11:
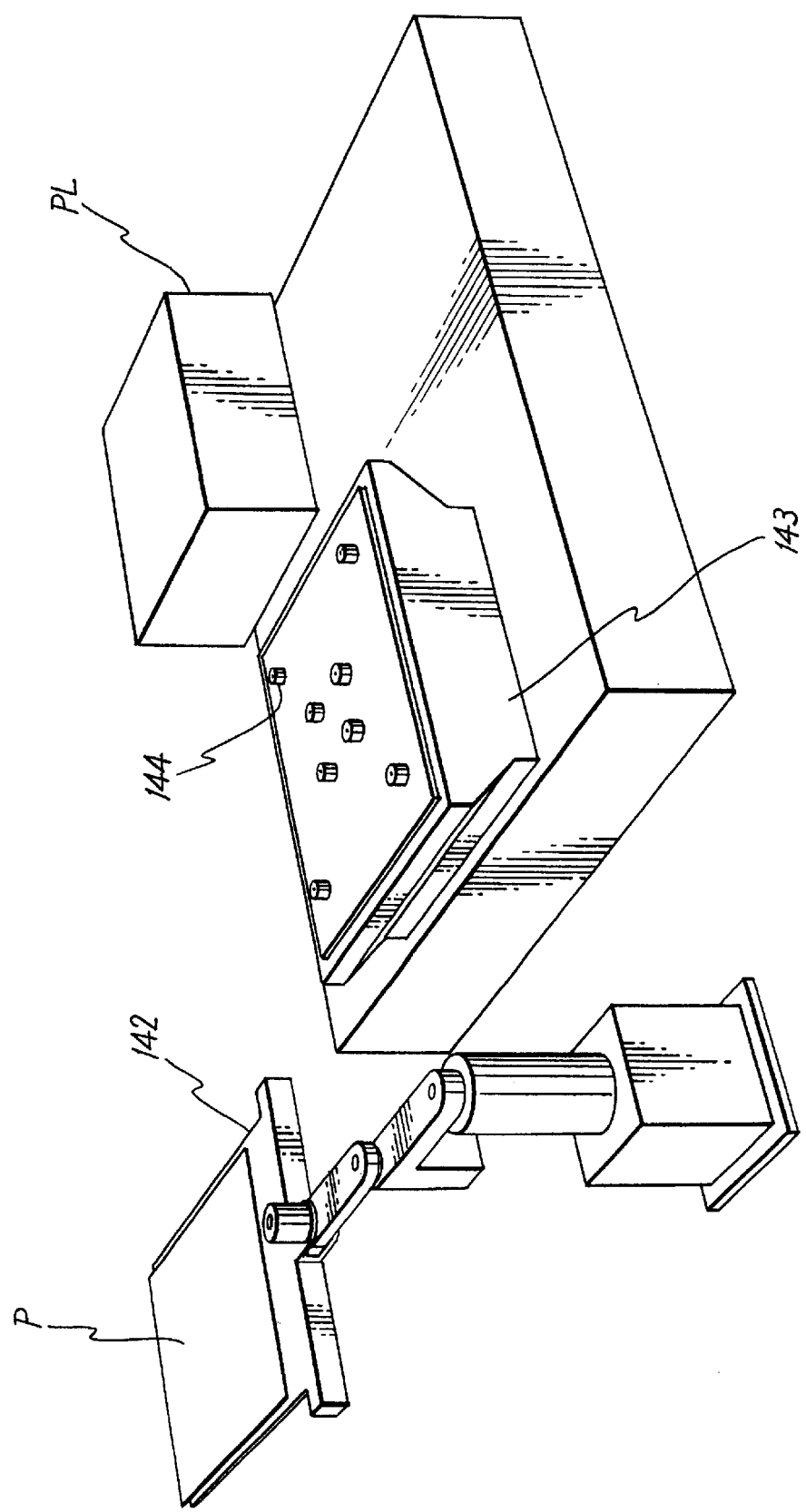
FIG. 11 is an explanatory view showing a conventional example.
Figure 12:
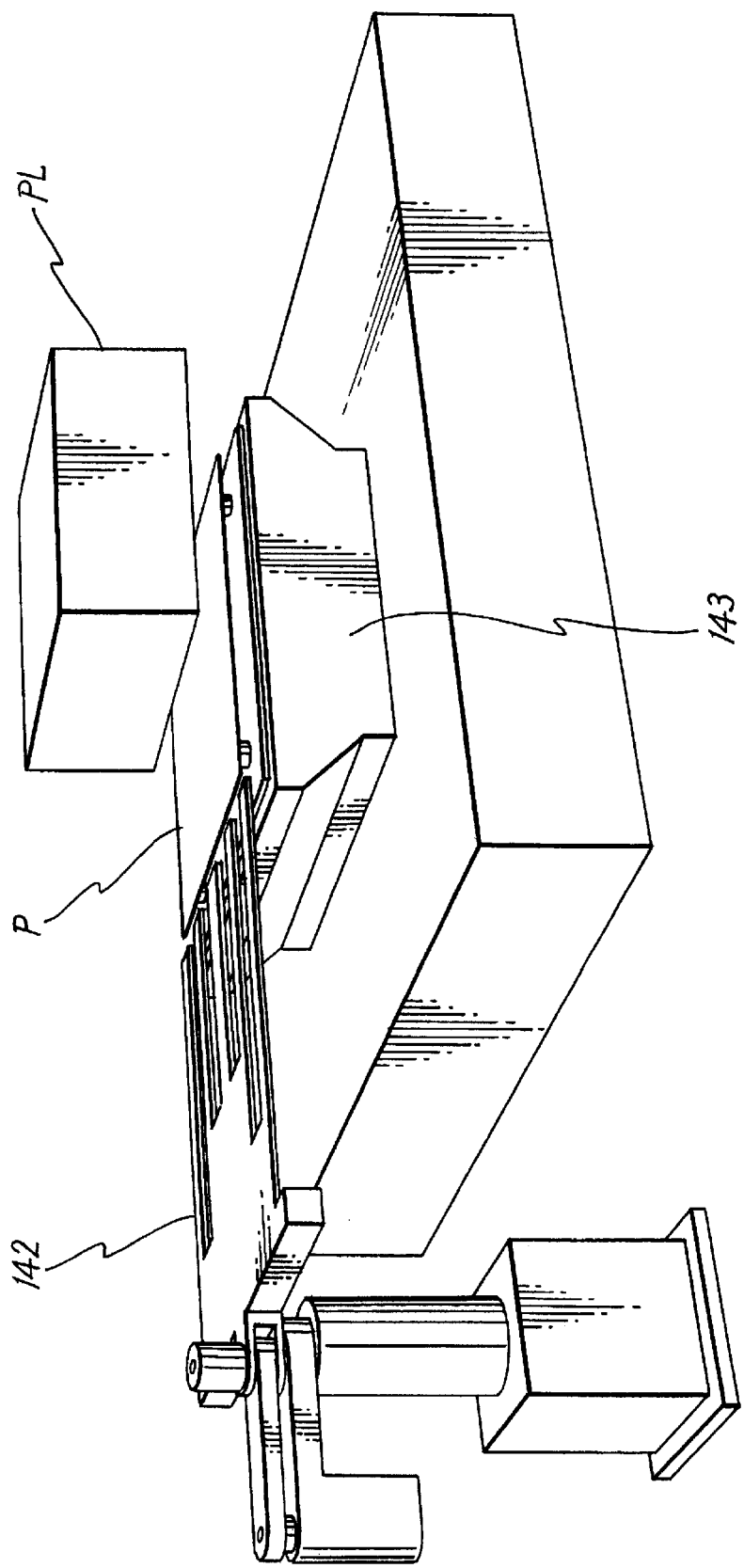
FIG. 12 is an explanatory view showing a conventional example.

According to this embodiment, as described earlier, the substrate supporting apparatus 26 which is transferred and exchanged integrally with the plate P, is structured so as to support the surface of the plate P with lines, and not by points. This allows almost the entire surface of the plate P to be supported evenly, so even when the plate P becomes larger in size flexure or damage caused by the flexure can be prevented effectively during transfer and exchange. Since the transfer arm 24 mounts and removes the plate P on the holder 14 integrally with the substrate supporting apparatus 26, such an interim loading/unloading mechanism with the conventional supporting bars (refer to FIG. 11) can be eliminated. The plate P can also be transferred and exchanged without being flexed. The plate P, therefore, can be exchanged if the space in between the holder 14 and a member above the holder 14 (for example, the projection optical system PL) is slightly larger than the thickness of the substrate supporting apparatus 26 with the plate P supported. Consequently, regardless of the limited space above the holder 14 (the surface for mounting a plate), the plate P can be transferred quickly and safely without being damaged, and the plate P can also be exchanged directly under the projection optical system PL even if the numerical aperture (N.A.) becomes larger. The holder 14, therefore, does not need to be moved apart from the projection optical system PL in order to replace the plate P. This reduces the movement strokes of the holder 14, in turn reducing the time required for loading and unloading the plate P, resulting in improved throughput and reduced footprint (the area covered by the exposure apparatus installed).

The number of steps to exchange the plate is greatly reduced, compared with the conventional substrate exchanging system that is described previously. In view of this aspect, the time for exchanging the plate is reduced, thus improving the throughput level.

As described above, since the supporting bars are not necessary, the vertical movement mechanism for the supporting bars on the holder 14 are not required, thus no holes need to be opened for the vertical movements of the support bars on the holder 14. This allows a number of suction holes to be arranged almost uniform on the upper surface of the holder 14, in positions respective to the plurality of opening portions 33 of the substrate supporting apparatus 26. The entire surface of the plate P can be vacuum chucked evenly by the holder 14, which as a result, improves the flatness.

The plate P being free from flexure when being exchanged, can prevent the upper surface of the holder 14 from partially wearing down, thus allowing the upper surface of the holder to keep its flatness for a long period of time.

A plurality of plates can also be transferred at the same time, since the plate P is transferred in a method which the plate P is integrally transferred with the substrate supporting apparatus 26.

In the embodiment previously described, the first to third transfer mechanisms comprise the robot 20. The present invention, however, is not limited to this. That is, each of the transfer mechanisms may comprise a separate apparatus, or, alternatively, two of these transfer mechanisms, for example, the first and second transfer mechanisms may comprise the same apparatus.

In the embodiment above, the transfer arm 24 is moved in a direction perpendicular to the holder surface on which the plate is mounted, to fix or detach the supporting portion from the groove portion. Alternatively, the holder 14 may move in a direction perpendicular to the holder surface on which the plate is mounted, to fix or detach the supporting portion from the groove portion, as a matter of course.

The configuration of the substrate supporting apparatus 26 is not limited to the configuration described above. For example, the supporting portion may be formed by only a plurality of linear members arranged in a predetermined interval in the same direction. Alternatively, the outer portion of the supporting portion may be formed of a rectangular shaped single plate frame member which center is carved out in a rectangular shape. Or, the substrate supporting apparatus may be formed of a single plate on which several openings are formed in the inner portion. In any case, the substrate supporting apparatus have only to comprise a supporting portion for supporting a substrate, and that the supporting portion has at least one geometrically closed opening. In the case where a plurality of geometrically closed openings are provided, the openings can be of any size, and at least a part of the retaining portion may be formed of a plate-shaped porous member with a plurality of pores.

Alternatively, a structure may be employed in which the positioning portion(a portion for preventing misplacement) is stoppers such as positioning pins, projected upward at positions freely selected, which corresponds to three to four positions of the level differentiated portion 40 of FIG. 3 (the positions matching at least three of the four edges of the plate P).

Figure 4:
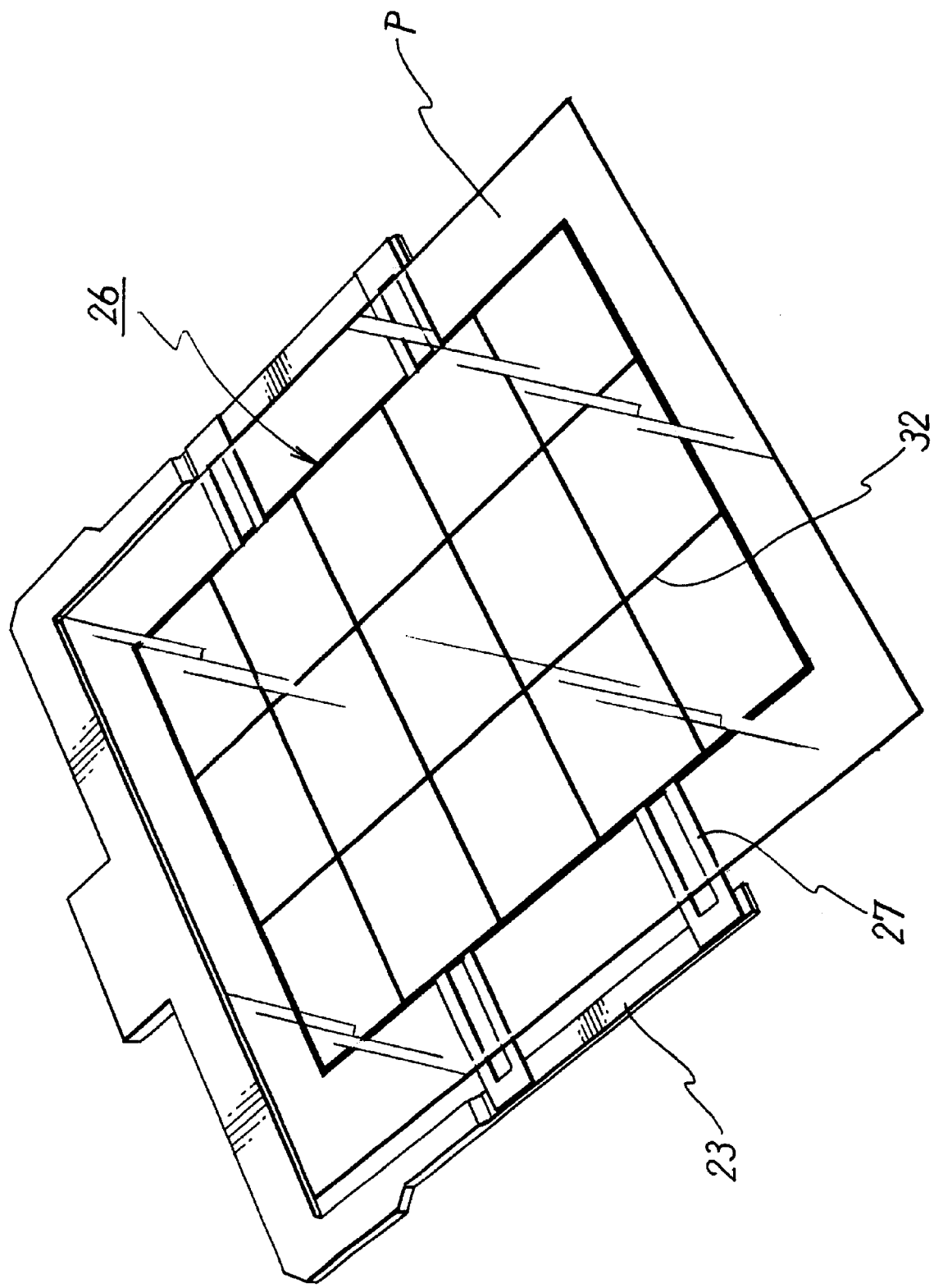
FIG. 4 is a perspective view showing a modified example of the substrate supporting apparatus.

The outer edge portion 50 including the frame 28 may alternatively support the plate P. FIG. 4 shows a modification of the substrate supporting apparatus 26. Components identical or equivalent to the substrate supporting apparatus 26 described in FIGS. 1 through 3 are designated with the same reference symbols, and the descriptions thereabout is entirely omitted.

In the substrate supporting apparatus 26 according to the modification, the frame 28 is smaller than the plate P. The outer portion is formed of the frame 28 and a total of four collar portions 27, two on both sides of the frame 28. The plate P is supported from underneath by the four collar portions 27 (part of the outer portion). The weight of the substrate supporting apparatus 26 can be reduced as in the modification, and the flexure of the plate P can be reduced by the collar portions 27, being a part of the outer portion, supporting the plate P. As a matter of course, the plate P may be supported by a part of the outer portion in FIG. 3 with both the supporting portion, in which the substrate supporting apparatus can again be reduced in weight, and the flexure of the plate P reduced.

The function of the substrate supporting apparatus 26, which has been described in the first embodiment and the modification, is now examined. The substrate supporting apparatus 26 requires at least two functions. That is, a supporting function to support the plate P without the plate P flexing, and a reinforcing function to reinforce the supporting portion so that the supporting portion does not flex due to external forces, such as the weight of the plate P itself. With the substrate supporting apparatus shown in FIG. 3 the linear members 32 have both the supporting function and the reinforcing function, and the frame 28 has the reinforcing function. With the modification shown in FIG. 4, each of the collar portions 27, the outer frame 28, and the linear members 32 have both the retaining function and the reinforcing function.

In the substrate supporting apparatus according to the present invention, various modifications of the function arrangement described above are available, and the arrangements are not limited to those mentioned earlier.

For example, opposite to the substrate supporting apparatus shown in FIG. 3, it is also possible to arrange the frame to have both the reinforcing function and the supporting function, and the linear members only having the reinforcing function. In this case, the linear members do not come into direct contact with the plate, so manufacturing becomes easy since the surface processing does not require the same level of smoothness as when the linear members are in direct contact with the plate.

Alternatively, the linear members may have both the supporting function and the reinforcing function, and the frame may be eliminated. In this case, the substrate supporting apparatus can be reduced in weight by the elimination.

Alternatively, the frame may have both the supporting function and the reinforcing function, and the linear members may be eliminated. In this case, the grooves for the linear members to be engaged(or fitted) can be eliminated on the holder 14, and the holder can be manufactured more easily and the substrate supporting apparatus can be reduced in weight due to the elimination.

The description above are such cases in which the substrate supporting apparatus has a plurality of geometrically closed openings, however, the present invention is not limited thereto. For example, with a substrate supporting apparatus similar to the substrate supporting apparatus shown in FIG. 3, the number of the linear members 32 may be reduced to 4 members and the members may be arranged in parallel crosses (in the shape of a sharp "#"). In this case, only one geometrically closed opening is available, however, it is still possible for the substrate supporting apparatus to have the sufficient holding function and reinforcing function.

With the substrate supporting apparatus according to the present invention, it is crucial that the opening portion provided on the supporting portion is geometrically closed for the following reasons.

When the opening portion is not geometrically closed, the portion not geometrically closed cannot support the plate, thus reducing the supporting function, while the reinforcing function may also be weakened by deformation which cannot be prevented only by the end portions spaced apart supporting the plate. On the contrary, when the opening portion is geometrically closed, even if the opening portion is formed of a combination of the linear members, each linear member forming the edges of the geometrically closed opening portion can support the plate together, thus having a sufficient supporting function. Also, when an external force is applied, all the members connected to each other surrounding the geometrically closed opening portion can work together to prevent deformation, thus having the sufficient reinforcing function (stiffness) described above.

In the first embodiment, the case in which each two of the collar portions 27 extending in parallel on both sides of the frame 28 as shown in FIG. 3, is described. However, the present invention is not limited thereto, and a plurality of collar portions can be arranged in radial along the opening portion (or the frame), which allow a plate larger in area than the opening portion to be supported steadily. The collar portions may be arranged at a higher level than that of the frame or the linear members, so that only the collar portions have a supporting function. This keeps the opening portion from being in contact with the plate, which simplifies the manufacturing since the surface processing does not require the same level of smoothness as when the opening is in direct contact with the plate.

Figure 5:
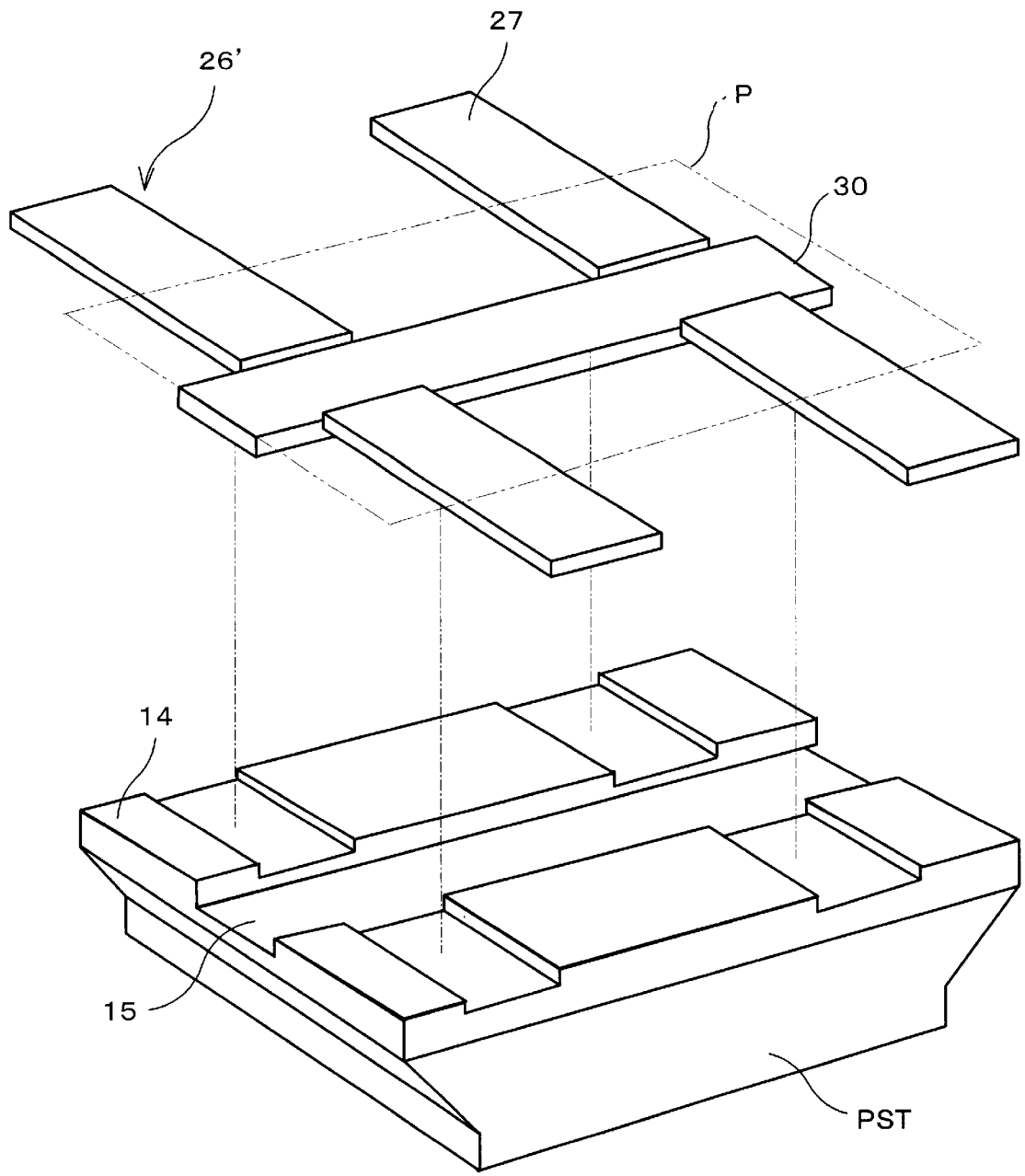
FIG. 5 is a schematic perspective view showing another modified example of a substrate supporting apparatus and a plate holder.

In the case when only the collar portions of the substrate supporting apparatus support the plate P, such a structure may be employed as is shown in the modified example in FIG. 5. In the modification shown in FIG. 5, for example, the substrate supporting apparatus 26' has four collar portions 27 which is elongated and made to have a relatively large area and a plate-shaped connecting portion 30 which connects the collar portions, integrally formed. In this case, a series of groove portions 15 is formed on the holder 14, into which the substrate supporting apparatus 26' entirely fits. The vacuum chucking of the plate P mounted on the holder 14 which is supported by the substrate supporting apparatus 26', is performed by the portion other than the groove 15 (the substrate contact surface). By this configuration, no openings are required in any of the collar portions 27 and the connecting portion 30.

Using any of the structures of the substrate supporting apparatus described above, in the present invention, the plate P can be supported and loaded/unloaded on the substrate mount surface of the holder by the substrate supporting apparatus, the loading member, the substrate supporting apparatus and the unloading member. Accordingly, interim loading/unloading members and a driving mechanism such as the conventional supporting bars can be eliminated.

Second Embodiment

A second embodiment according to the present invention is explained with reference to FIG. 6. Configurations identical or equivalent to those described in connection with the first embodiment are designated with the same reference numerals, and the description thereabout is omitted.

Figure 6:
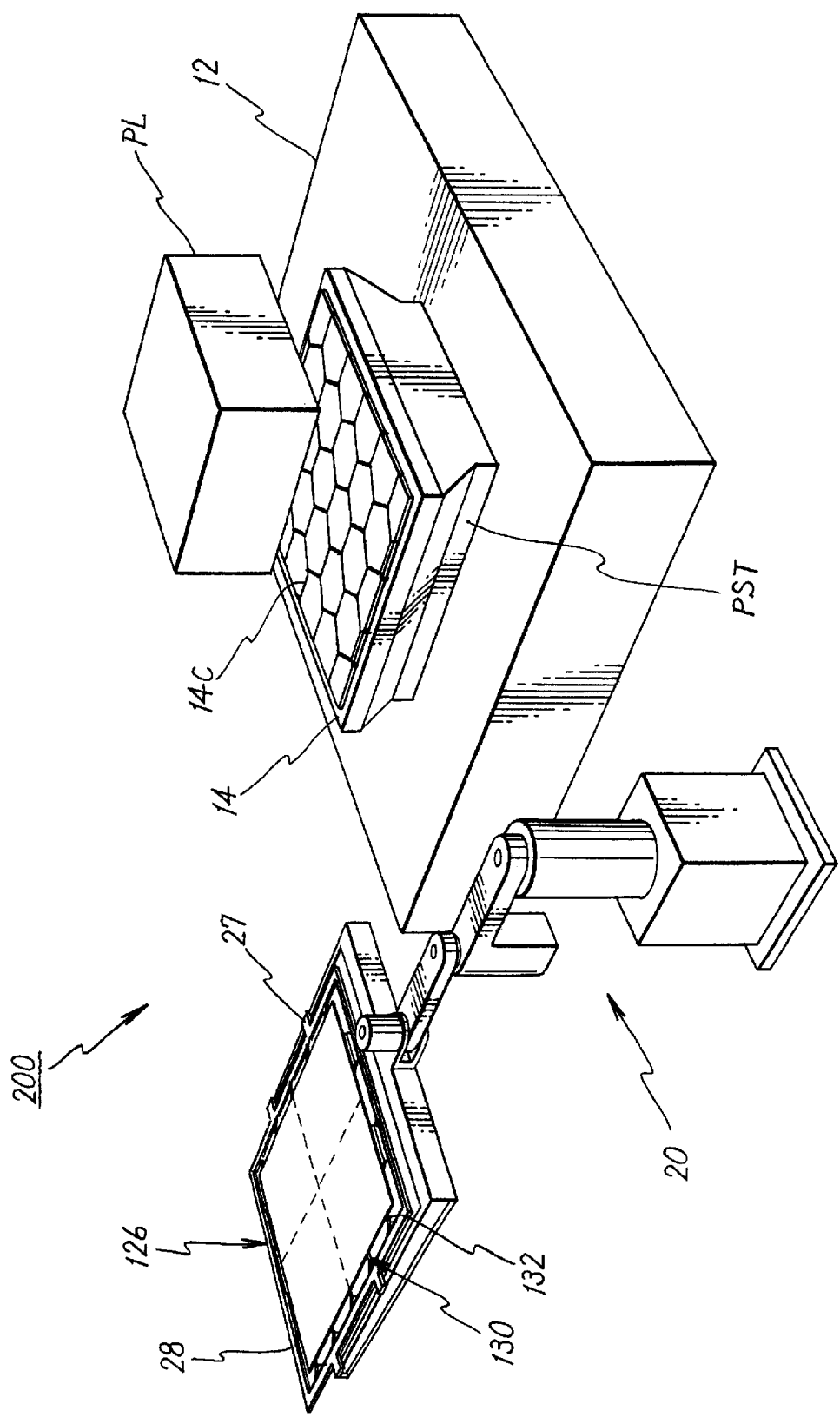
FIG. 6 is a schematic perspective view showing the structure of an exposure apparatus for liquid crystal display substrates, according to a second embodiment of the present invention.

FIG. 6 is a schematic perspective view showing an exposure apparatus 200 for a liquid crystal device comprising a substrate transfer apparatus according to the second embodiment. In this second embodiment, a substrate supporting apparatus 126 comprises a large rectangular frame 28 being one size larger than the plate P. The frame 28 has a supporting portion 130, which is constituted by a plurality of linear members 132 arranged in the shape of a honeycomb in the internal area. Accordingly, in this case, hexagonal opening portions are formed at predetermined intervals on the supporting portion 130. The plate P is positioned roughly on the supporting portion 130. The positioning is carried out before the plate P is loaded onto the substrate supporting apparatus 126 by a plate loading/unloading apparatus (not shown in Figs.). Similar to the first embodiment, a positioning portion may be formed at the center of the honeycomb-shaped retaining portion 130, comprising level differential portions to fit the plate P therein or arrange positioning pins.

The shape and size of the cross section of each of the linear members 132, which constitute the supporting portion 130, may be of any shape, for example, a circular shape, a rectangular shape, or an elongated rectangular shape. The linear members 132 which constitute the retaining portion 130, may be formed integrally, or a plurality of linear members 132 may be arranged in the shape of a honeycomb and then welded or adhered together to form a honeycomb-shaped surface. The size of openings made by the linear members 132 are determined by the size and thickness of the plate P, so as not to cause the plate P to flex significantly or to be damaged.

On the upper surface of the holder 14, honeycomb-shaped narrow shallow grooves 14c are formed to coincide with the honeycomb-shape of the supporting portion 130 of the substrate supporting apparatus 126.

The configuration of other portions and the like are identical or equivalent as those of the first embodiment.

According to the second embodiment structured as described, action and effect identical or equivalent to the first embodiment, can be obtained. Since the supporting portion 130 of the substrate supporting apparatus 126 is honeycomb-shaped, the substrate supporting apparatus can be light in weight and resistant to flexure. To decrease the weight as well as increase the stiffness, highly stiff material may be used.

Third Embodiment

FIGS. 7 through 10 refer to a third embodiment according to the present invention. Components identical or equivalent to those described in connection with the first embodiment are designated with the same reference numerals and the description thereabout is briefly made or entirely omitted.

Figure 7:
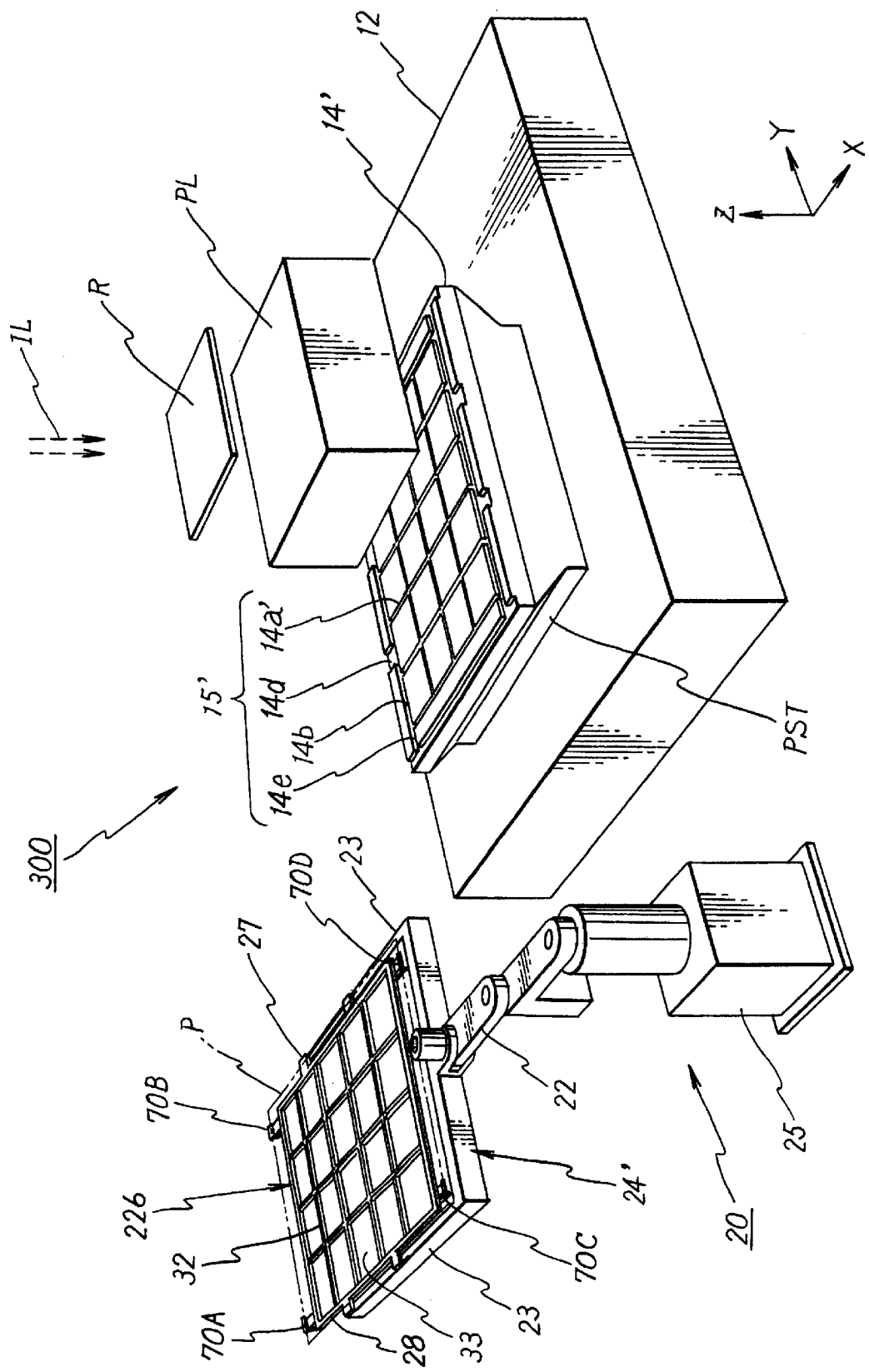
FIG. 7 is a schematic perspective view showing the structure of an exposure apparatus for liquid crystal display substrates, according to a third embodiment of the present invention.

FIG. 7 is a schematic perspective view showing an exposure apparatus 300 for liquid crystal display substrates employing the step and scan method, including a substrate supporting apparatus according to the third embodiment. The exposure apparatus 300 according to the third embodiment is characterized in that a substrate supporting apparatus 226 is arranged in place of the substrate supporting apparatus 26 in the first embodiment, a transfer arm 24' is arranged in place of the transfer arm 24 of the robot 20, and a plate holder (hereinafter referred to as a "holder") 14' as a substrate holder is arranged in place of the holder 14.

The substrate supporting apparatus 226 is employed to support a plate P larger in area compared with the substrate supporting apparatus 26. The substrate supporting apparatus 226 comprises a rectangular frame 28 a size smaller than the plate P, and a plurality of linear members 32 that are arranged in a grid pattern at a predetermined interval in the inner area of frame 28. A plurality of rectangular opening portions 33 is formed inside each of the grids that are formed by the plurality of linear members 32. The plurality of linear members 32 employed has a rectangular cross section elongated in the direction of height. These linear members 32 are combined in a grid pattern with each other and the end of the linear members 32 is welded onto the inner portion surface of the frame 28. In addition, on both the elongated edges of the outer frame 28, collar portions 27 in a pair of two, being a total of four are projected outwardly similar to the first embodiment.

As shown in FIG. 7, in the third embodiment, the plate P as a substrate is supported by a part of the frame 28, linear members 32 arranged in a grid pattern on the inner area of frame 28, and collar portions 27 (refer to FIG. 8) respectively. In other words, the supporting portion which supports the plate P is configured of the frame 28, the linear members 32 arranged in a grid pattern on the inner area of frame 28, and the four collar portions 27.

FIG. 7 shows a substrate holding mechanism 70A–70D, in pairs, arranged on the transversal sides of frame 28.

Figure 8:
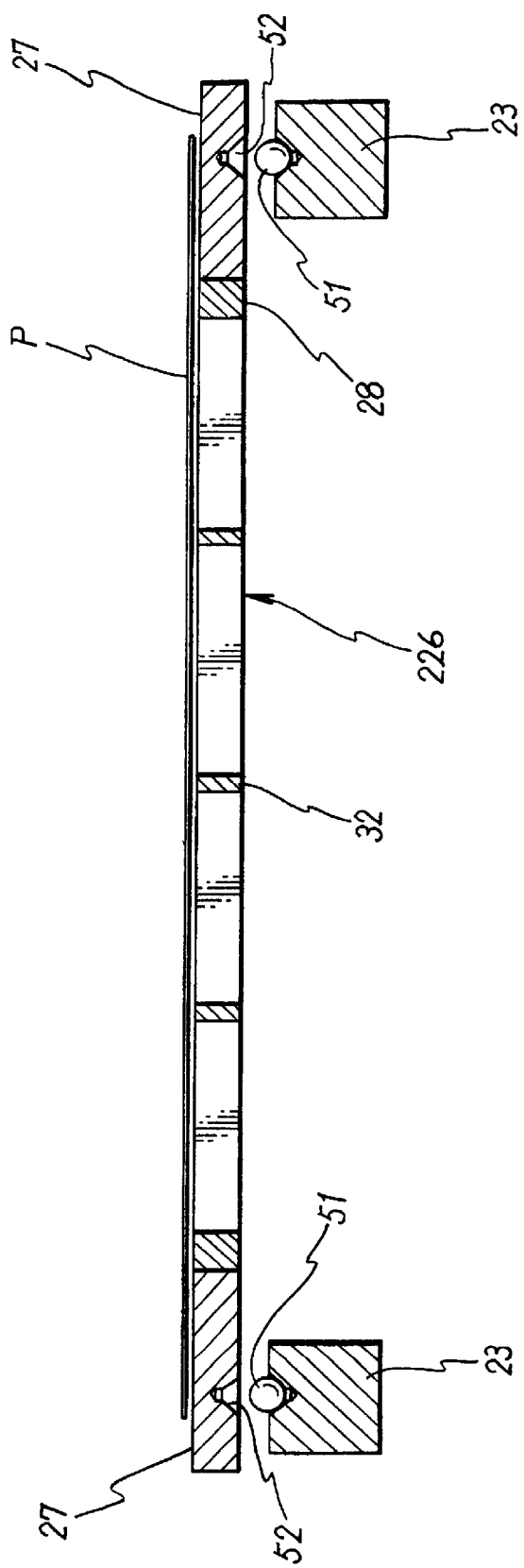
FIG. 8 is a longitudinal sectional view showing a substrate supporting apparatus, which is supporting a plate of the third embodiment, with its prong portions.

FIG. 8 is an explanatory cross-sectional view showing the method of positioning and holding the collar portions 27 of the substrate supporting apparatus 226, when supported from underneath by the prong portions 23 of the transfer arm 24'. It is a cross-sectional view showing the state in which the substrate supporting apparatus 226 supporting the plate P is just about to be supported by the prong portions 23. The cross section is taken along a plane passing through the center of a pair of the collar portions 27 arranged on either sides of frame 28.

As shown in FIG. 8, on the lower surface of each of the collar portions 27 a recessed portion or a conical groove 52 is formed. In respect to the conical groove 52, a recessed portion identical to the conical groove 52 is formed on the upper surface of the prong portions 23. A ball member 51 is fitted into the identical recessed portion and fixed and adhered thereto. In this case, around half of the ball 51 is exposed above the upper surface of the prong portions 23, forming a semispherical projected portion which fits into the conical groove 52, as a projected portion with a spherical surface. In the following description, this semispherical projected portion is called the projected portion 51 for the sake of convenience. The material of the ball member 51 may be of any such as metal, plastics, or ceramics, and is not specified in particular.

In this embodiment, since a pair of the collar portions 27 is arranged on either sides making a total of four collar portions, a conical groove 52 is formed at each of the collar portions 27 making it four conical grooves 52 arranged on the substrate supporting apparatus 226. Four projected portions 51, each fitting into the four conical grooves 52, are arranged on a pair of prong portions 23 in the same positional relationship as the four conical grooves 52 mentioned above. Accordingly, each of the conical grooves 52 is subject to rough positioning, so that the complementary projected portions 51 is located just about opposite of the grooves. Then, by simply mounting the substrate supporting apparatus 226 onto the prong portion 23, the substrate supporting 226 can be held at a preferred position in respect to the prong portion 23, by the transfer arm 24. That is, the conical grooves 52 and the corresponding projected portions 51 are each coupled to form a positioning unit, adding up to four sets of positioning units. The four sets of positioning units configure the positioning mechanism, which sets the positional relationship between the substrate supporting apparatus 226 and the transfer arm 24' to a predetermined relationship.

The reason for the term rough positioning, is because even if the positioning of the substrate supporting apparatus 226 and the pair of the prong portions 23 of the transfer arm 24' is more or less off the preferable position, the conical grooves 52 slide along the surface of the projected portions 51 when the substrate supporting apparatus 226 is mounted on the transfer arm 24', to adjust the positional relationship between the two by themselves (automatically). Consequently, both are arranged at the predetermined position where the center of the conical grooves 52 coincides with that of the projected portions 51 (refer to FIG. 9).

Under this positioning state, the substrate supporting apparatus 226 is restricted of movements in the horizontal direction and thus misplacement is prevented. Meanwhile, the projected portions 51 of the prong portions 23 and the conical grooves 52 of the substrate supporting apparatus 226 can easily be detached since there are no restrictions in the vertical direction. By the positioning mechanism described above, the misplacement of the substrate supporting apparatus 226 can be prevented, while being transferred. Accordingly, the prong portions 23 of the transfer arm 24' do not need vacuum chucking arrangements or the like, and power source such as a vacuum pump is not required, therefore, allowing cost reduction.

At least one set of the positioning units may have a relationship between the projected portions and the conical grooves (recessed portions), reversed to the relationship described above. That is, the conical groove may be formed on the side of the prong portions 23, and the projected portion may be arranged on the substrate supporting apparatus side.

Referring back to FIG. 7, the holder 14' mounted on the plate stage PST is formed larger than the holder 14 so as to cope with a plate P larger in size. On the upper surface of the holder 14' a series of grooves are formed (groove portion 15'). The supporting portion of the substrate supporting apparatus 226 (the frame 28, the linear members 32 arranged in a grid pattern in the inner area of frame 28, and the collar portions 27) and the four substrate holding mechanisms 70A–70D fit into the groove portion 15'. The groove portions 15' include a grid-shaped groove 14a' identical to the groove 14a described earlier, which a plurality of linear members 32 arranged in a grid pattern fit into. The groove portions 15' also include rectangular annular grooves 14b into which the frame 28 larger in width than the groove 14a' and which is formed around the groove 14a' fit. Grooves 14d, also included in the groove portion 15', are formed on both sides in the X axis direction of the holder 14', two on each sides in connection with the grooves 14b. The base end portions of the collar portions 27 fit into the grooves 14d, and they are wider that the annular grooves 14b. The groove portions 15' further include grooves 14e which have four grooves, having almost the same width as the grooves 14d, and are formed on both sides of the Y axis direction of the holder 14' in connection with the grooves 14b. Each of the substrate supporting mechanisms 70A–70D fit into the grooves 14e.

The grooves 14e have a depth slightly deeper than that of other grooves 14a', 14b, and 14d. Grooves 14a', 14b, and 14d have approximately the same depth, which is deep enough for the frame 28 and the linear members 32 to fit in perfectly (below the upper surface level of holder).

Figure 9:
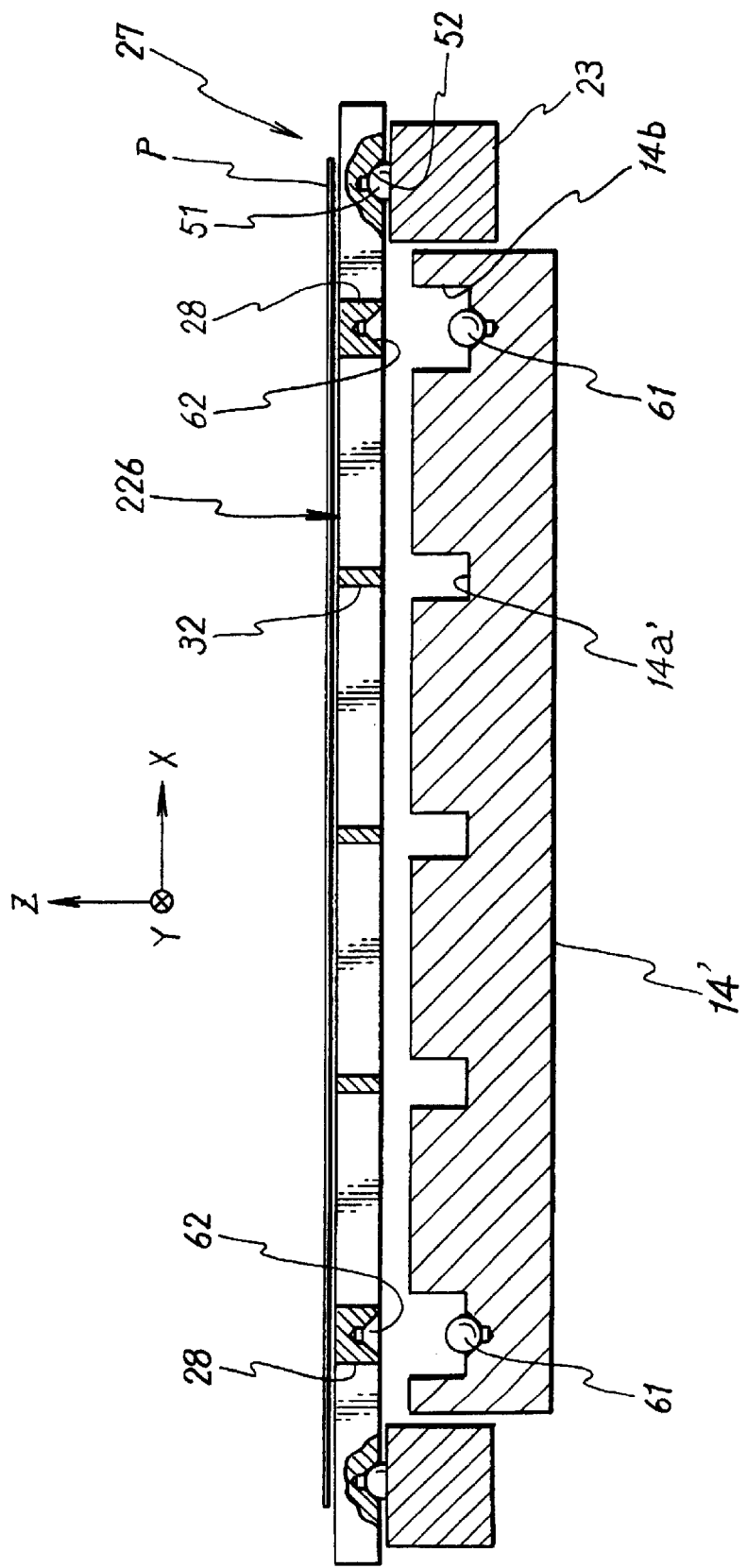
FIG. 9 is a longitudinal sectional view of a plate holder according to the third embodiment, with a substrate supporting apparatus held by prong portions.

FIG. 9 is a cross-sectional view of the substrate supporting apparatus 226, which is holding the plate P and is just about to be mounted on the holder 14'. The substrate supporting apparatus is held by the transfer arm 24', by its prong portions 23. As shown in FIG. 9, in this third embodiment, recessed portions or conical grooves 62 are formed at a plurality of predetermined positions (in this case, near the four corners of frame 28) on the lower surface of frame 28 of the substrate supporting apparatus 226. Corresponding to each of the conical grooves 62, recessed portions identical to the conical grooves 62 are formed at four predetermined positions on the inner bottom surface of the annular grooves 14b of the holder 14'. Ball members 61 are fitted and fixed into the recessed portions by adsorbent or the like. In this case, about half the ball member 61 is exposed from the inner bottom surface of the annular groove 14b, and the upper half of the ball 61 member forms a semispherical projected portion which fits into the conical groove 62 as a projected portion with a spherical surface. In the following description, this semispherical projected portion is called the projected portion 61 for the sake of convenience. The material of the ball member 61 may be of any such as metal, plastics, or ceramics, and is not specified in particular.

The four projected portions 61, each fitting into the four conical grooves 62, are arranged in the same positional relationship as the four conical grooves 62. Accordingly, each of the conical grooves 62 and the four projected portions are arranged so as to oppose each other when rough positioning, is performed. Rough positioning, is positioning to an extent of moving the transfer arm 24' holding the substrate supporting apparatus 226 so that each relative portion of the substrate supporting apparatus opposes grooves 14a', 14b, 14d and 14e forming the groove portion 15' on the upper surface of the holder 14'. After such rough positioning, the transfer arm 24' is driven downward, and the substrate supporting apparatus 226 is mounted onto the holder 14' in the same manner as in the first embodiment, allowing the substrate supporting apparatus 226 to be positioned at the preferable position relative to the holder 14'. That is, each of the conical grooves 62 and the corresponding projected portions 61 are coupled to form a positioning unit, adding up to four sets of positioning units. The four sets of positioning units configure the positioning mechanism, which sets the positional relationship between the substrate supporting apparatus 226 and the holder 14' to a predetermined relationship.

Again, in this case, when the substrate supporting apparatus 226 is mounted on the holder 14', even if the positioning of the substrate supporting apparatus 226 and the holder 14' is more or less off the preferable position, the conical grooves 62 slide along the surface of the projected portions 61 when the substrate supporting apparatus 226 is mounted on the holder 14', to adjust the positional relationship between the substrate supporting apparatus 226 and the holder 14' by themselves (automatically). Consequently, both are arranged at the predetermined position where the center of the conical grooves 62 coincides with that of the projected portions 61.

Under this positioning state, the substrate supporting apparatus 226 is restricted of movements in the horizontal direction and thus misplacement is prevented. Meanwhile, the projected portions 61 and the conical grooves 62 of the substrate supporting apparatus 226 can easily be detached since there are no restrictions in the vertical direction. By the positioning mechanism above, the misplacement of the substrate supporting apparatus 226 while being moved can be prevented, during, for example, such as scanning or stepping movements in exposure. Accordingly, the holder 14' do not need any suction holes (vacuum chucking) or the like in order to vacuum the lower surface of the frame 28 and thus no piping arrangement is required, thereby reducing the cost.

At least one set of the positioning units may have a relationship between the projected portions and the conical grooves (recessed portions) reversed to the relationship described above. That is, the conical groove may be formed on the holder 14', and the projected portion may be arranged on the substrate supporting apparatus side.

Next, the configuration and the action of the substrate holding mechanisms 70A–70D, mentioned earlier, are explained with reference to FIGS. 10(A) and (B) by discussing the substrate holding mechanism 70B as a typical example.

Figure 10A:
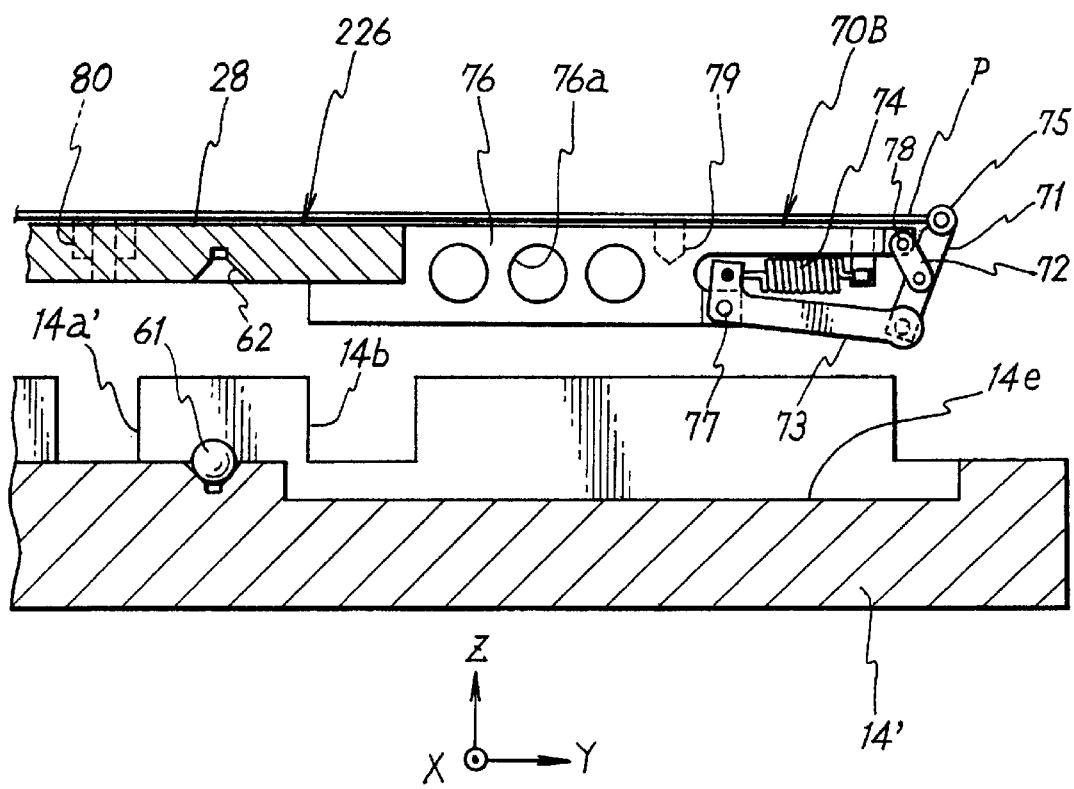
FIG. 10(A) is a longitudinal sectional view showing a substrate supporting apparatus which is supporting a plate according to the third embodiment, and the apparatus is just about to be mounted on a plate holder.
Figure 10B:
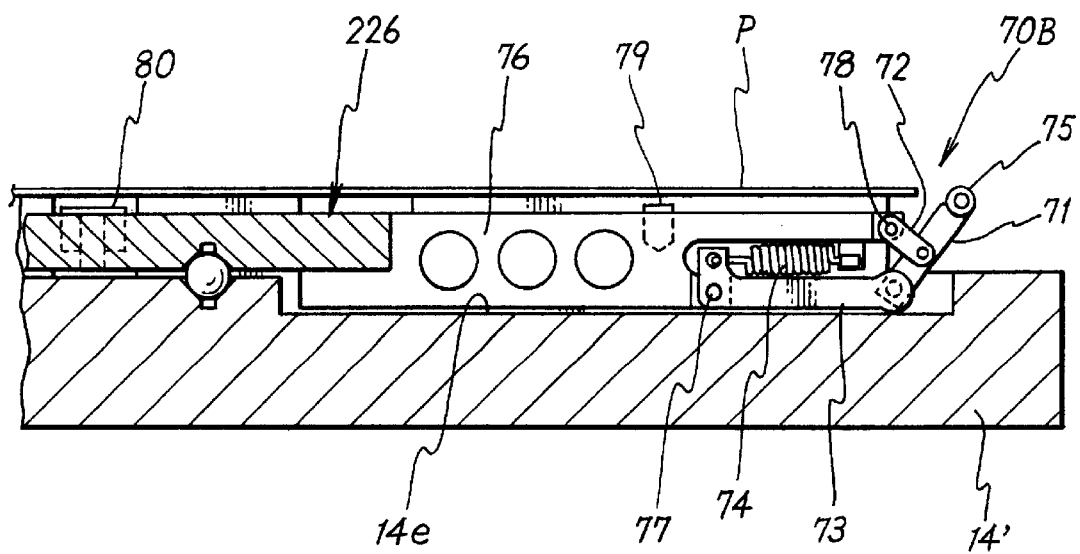
FIG. 10(B) is a longitudinal sectional view showing a substrate supporting apparatus which is supporting a plate according to the third embodiment, and the apparatus is mounted on a plate holder.

FIG. 10(A) is a cross-sectional view of the substrate supporting apparatus 226, which is holding the plate P and is just about to be mounted on the holder 14'. FIG. 10(B) is a cross-sectional view of the substrate supporting apparatus 226 holding the plate P, being mounted on the holder 14'.

As shown in FIGS. 10(A) and (B), the substrate holding mechanism 70B comprises a four-bar linkage including a base block 76 that is fixed with bolts or the like (not shown in Figs.) to the frame 28 of the substrate supporting apparatus 226, constituting a link mechanism. The substrate holding mechanism 70B also comprises a tensile coil spring 74 as an elastic member.

More particularly, the base member 76 is made up of a plate-shaped member having a predetermined thickness, in which circular openings 76a are formed at predetermined intervals in order to reduce the weight thereof. At an end portion opposite to the frame 28 of the base member 76, an extended portion having a predetermined shape forms a fixed portion (hereinafter referred to as the "fixed link") of the link mechanism described above. On one end portion of the fixed link via a shaft 77, one end of a first link 73 is rotatably connected. On the other end of the fixed link 73, one end of a second link 71 is connected via a connecting shaft. In the center portion of link 71, in the longitudinal direction, one end of the third link 72 which is the shortest of the three, is connected via a connecting shaft. The other end of the link 72 is connected rotatably to the other end portion of the fixed link via a shaft 78. Starting from the position shown in FIG. 10(A), swinging (rotating) link 73 in the counterclockwise direction in FIG. 10(A) with shaft 77 as a center causes the third link 72 to rotate in the counterclockwise direction in FIG. 10(A) with shaft 78 in the center. Corresponding with this movement, link 71 rotates in the clockwise direction in FIG. 10(A) with the connecting shaft shared with the link 72 in the center. In this embodiment, with this rotation, the other end of the link 71 is structured to move substantially in parallel along the Y-axis. That is, in this embodiment, a so-called locust-type parallel motion mechanism, which is a type of a Scott Russell mechanism that performs the Scott Russell's parallel motion, is employed.

In this case, the longer the length of the first link 73 is compared with other links, the closer the motion of the other end of the link 71 becomes parallel.

As described above, the approximate parallel motion of the other end of the link 71 allows the link 71 to pressure the plate P substantially from the horizontal direction thereof, if a force is applied to the link 73 in the clockwise direction in FIG. 10(A) at all times. Thus, in this third embodiment, the elastic force of the tensile coil spring 74 works as the force mentioned above, and a holding pad 75 is fixed to the end of the link 71 to pressure the plate P horizontally.

The substrate holding mechanisms 70A, 70C, 70D also are identical in configuration as with the substrate holding mechanism 70B described above.

In this embodiment, as shown in FIG. 7, the substrate holding mechanisms 70C, 70D are arranged just about opposite to the substrate retaining mechanisms 70A, 70B, on frame 28. Consequently, the plate P is pressured and clasped by the four substrate holding mechanisms 70A–70D described above from both sides, in the longitudinal direction.

As shown in FIG. 10(B), when the substrate supporting apparatus 226 supporting the plate P is mounted on the holder 14' as previously described, the holding (clasping) of the plate P by the four substrate holding mechanisms 70A–70D is released as follows. The connecting portion of the first link 73 and the second link 71 comes into contact with the inner bottom surface of the grooves 14e, and the force corresponding to the weight of the substrate supporting apparatus 226 itself including the plate P presses the inner bottom surface downward. The reaction force thereof rotates the first link 73 in the counterclockwise direction in FIG. 10(B) with the shaft 77 as the center, against the elastic force of the tensile coil spring 74. As mentioned above, this causes each holding pad 75 to perform approximate parallel motion, which releases the holding (clasping) of the plate P. That is, when the substrate supporting apparatus 226 is mounted on the holder 14', the weight of the substrate supporting apparatus 226 itself overrules the force caused by the tensile coil springs 74 of the link mechanisms 70A–70D. This, in turn, releases the clasping of the plate P by the link mechanisms 70A–70D.

As described, when the substrate supporting apparatus 226 is mounted on the holder 14', the plate P is released from the clasping due to the weight of the substrate supporting apparatus 226 itself supporting the plate P, without being affected by any external force. The inertial force working on the vacuuming surface of the plate P of the holder 14' is, therefore, smaller in comparison with the case when the plate P and the substrate supporting apparatus 226 are integrated. This allows a small suction force by the holder 14' while moving the plate stage PST, such as during scanning exposure and stepping movements.

As a matter of course, to lift the substrate supporting apparatus 226 off the holder 14' with the transfer arm 24' after exposure dissolves the force caused by the weight of the substrate supporting apparatus 226 itself, which worked on the link mechanisms 70A–70D, as shown in FIG. 10(A). The tensile force caused by the tensile coil spring 74 then causes the four holding pads 75 to move in approximate parallel motion and clasp the plate P from the horizontal direction.

According to the third embodiment, the substrate holding mechanisms 70A–70D can make the substrate supporting apparatus 226 clasp (hold) and release the plate P as required without applying any external force. The substrate holding mechanisms 70A–70D are also compact and light in weight therefore they can be employed in places where space is limited.

In the third embodiment, in the case the substrate supporting apparatus 226 is made of metal as shown in FIGS. 10(A) and (B), spacer members may be arranged. Like spacer members 79 and 80, the spacer members may be cap-like spacer members made from low frictional sliding material. They can be arranged on the intersecting points of the linear members 32 or at a plurality of positions on the base member 76, and support the plate P from underneath to prevent the plate P from being in contact with the substrate supporting apparatus 226.

The configuration of other parts and the operation of each portion such as the method of transferring and exchanging the plate P are the same as of those of the first embodiment, and the detail description is omitted.

In the third embodiment, as is described, the same effect as that of the first embodiment can be obtained. With the simple construction, the substrate supporting apparatus can be positioned relative to the prong portions of the transfer arm, as well as to the holder. Moreover, the plate P can be clasped or released in response to the force caused by the weight of the substrate supporting apparatus itself.

Furthermore, in the third embodiment above, the case has been explained in which the conical grooves 52, four in total, are formed on the four collar portions 27 of the substrate supporting apparatus 226. Spherical projected portions 51, two each, are arranged on each of the prong portions 23 of the transfer arm 24', corresponding to the conical grooves 52. Accordingly, four sets of positioning units are formed each comprising a conical groove 52 and a corresponding semispherical projected portion 51. The four sets of positioning units constitute the positioning mechanisms for setting a predetermined positional relationship between the substrate supporting apparatus 226 and the transfer arm 24'. However, the present invention is not limited thereto.

For example, a conical groove may be formed on each of any two or three of only the four collar portions 27. The projected portions 51 may be provided correspondingly on the predetermined two or three positions on the prong portions 23, thus two or three sets of positioning units may be configured. As a matter of course, at least one set of positioning units may be configured so that the conical groove and the projected portion are arranged opposite to each other.

Alternatively, the substrate supporting apparatus may have a pair of collar portions, extending outward on both sides in the direction of the elongated sides of the frame, so as to make the area in contact with the prong portions 23 relatively large. The substrate supporting apparatus can be held via the collar portions with a pair of prong portions 23. In such a case, only two sets of positioning units comprising the projected portions and conical grooves described earlier need to be arranged.

In addition, instead of the conical grooves constituting the positioning unit, V grooves can be arranged as the recessed portion into which the projected portions 51 fit. However, in the case when all the recessed portions of the positioning units are made up of V grooves, the direction of at least one V groove needs to differ from the others. Such consideration is not required when the recessed portion of at least one positioning unit is a conical groove.

As the projected portion for at least one positioning unit among a plurality of positioning units, it is also possible to arrange a projected portion other than a spherical projected portion. In such a case, the recessed portion may be arranged in respect to the projected portion, for example, when a projected portion has the shape of a truncated cone, a conical groove into which the truncated cone projected portion fit into can be arranged as the recessed portion.

Furthermore, in the third embodiment above, the case has been explained in which the conical grooves 62 are formed at four positions on the bottom surface of the frame 28 of the substrate supporting apparatus 226. Four corresponding semispherical projected portions 61 are arranged on the upper surface of the holder 14', structuring four sets of positioning units. The four sets of positioning units form a positioning mechanism that sets a predetermined positional relationship between the substrate supporting apparatus 226 and the holder 14'. However, the present invention is not limited thereto.

For example, the substrate supporting apparatus 226 may have conical grooves formed at two or three predetermined portions on the bottom surface. The corresponding projected portions 61 can be arranged on the predetermined two or three positions on the holder 14', thus two or three sets of positioning units may be configured. As a matter of course, at least one set of positioning units may be configured so that the conical groove and the projected portion are arranged opposite to each other.

In addition, instead of the conical grooves constituting each of the positioning units that position the substrate supporting apparatus 226 and the holder 14', V grooves can be arranged as the recessed portion into which the projected portions 61 fit. However, in the case when all the recessed portions of the positioning units are made up of V grooves, the direction of at least one V groove needs to differ from the others. Such consideration is not required when the recessed portion of at least one positioning unit is a conical groove.

As the projected portion of at least one positioning unit of a plurality of positioning units, it is also possible to provide a projected portion (for example, a projected portion having the shape of a truncated cone) other than a spherical projected portion. In such a case, a recessed portion into which the projected portion fit into (for example, a conical groove) may be arranged, in respect to the projected portion.

Furthermore, in the third embodiment above, the conical grooves 52 are arranged on the lower surface of the collar portions 27 of the substrate supporting apparatus 226, and the projected portions 51 are arranged on the upper surface of the prong portions 23 of the transfer arm 24'. In the case the projected portions 61 are further provided on the upper surface of the holder 14', the conical grooves 52 can be arranged to fit into any one of the projected portions 51 or the projected portions 61. Specifically, for example, the projected portions 51 and the projected portions 61 may be formed identically, with the projected portions 61 being arranged on each inner bottom surface of the grooves 14d into which each of the four collar portions 27 of the holder 14' is fitted (engaged). This obviates the need of arranging the conical grooves 62 on the frame 28 of the substrate supporting apparatus 226.

Also, in the third embodiment, the case has been explained in which the substrate supporting apparatus 226 configured with four substrate holding mechanisms 70A–70D, with two of the mechanisms located on each side. The substrate holding mechanisms pressure or release the plate P from each side in response to the action of the weight of the substrate supporting apparatus 226 itself. These four substrate holding mechanisms constitute a misplacement preventing portion to prevent the plate P from being misplaced. The substrate holding mechanisms 70A–70D can be arranged to have various functions by setting the tensile force of each of the tensile coil springs 74 as appropriate.

For example, when the sum of the forces of the holding pads 75 of the substrate holding mechanisms 70A, 70B which pressure the plate P, and the sum of the forces of the holding pads 75 of the substrate holding mechanisms 70C, 70D, are sufficiently smaller than the frictional force between the plate P and the substrate supporting apparatus 226 (vertical reaction×static frictional coefficient), the plate P mounted on the substrate supporting apparatus 226 by a plate loading/unloading apparatus (not shown in Figs.) does not move on the substrate supporting apparatus 226 when the substrate holding mechanisms 70A–70D clasps the plate P. The plate P is also prevented from being misplaced on the substrate supporting apparatus 226 due to vibration while being transferred. That is, the substrate holding mechanisms 70A–70D functions as only a misplacement preventing portion.

Alternatively, for example, if, as a substrate holding mechanism 70A–70D, an identical configuration including the tensile coil springs 74 is employed, and the tensile force of the tensile coil springs 74 is set so that the sum of the forces of the holding pads 75 of the substrate holding mechanisms 70A, 70B for pressuring the plate P and the sum of the forces of the holding pads 75 of the substrate holding mechanisms 70C, 70D for pressuring the plate P are both sufficiently larger than the frictional force between the plate P and the substrate supporting apparatus 226 (vertical reaction×static frictional coefficient), the plate P can be positioned exactly in between the substrate holding mechanisms 70A, 70B and the substrate holding mechanisms 70C, 70D. That is, the substrate holding mechanisms 70A–70D function as a positioning mechanism, thus allowing a so-called pre-alignment of the plate P on the substrate supporting apparatus 226. As a matter of course, in this case, the substrate P can also be prevented from being misplaced due to vibration while being transferred on the substrate supporting apparatus 226.

Furthermore, in the case mechanisms identical to the substrate holding mechanisms 70A–70D are arranged as the substrate holding mechanism, at least one set of a substrate holding mechanism arranged both sides of the plate P need to be arranged. The pre-alignment described above can also be performed, by setting each the tensile force of the tensile coil springs 74 to an appropriate value.

In addition, at least one substrate moving mechanism comprising the same mechanism as the substrate holding mechanisms 70A–70D described above, can be arranged on only one side of the substrate supporting apparatus 226. A reference member which functions as a positioning reference in contact with the edges of the plate P may be arranged on the other side opposite, the base member 76, to configure a substrate misplacement preventing apparatus which functions as a positioning mechanism (positioning correcting apparatus).

The substrate moving mechanism constituting the misplacement preventing apparatus, pushes a side of the plate P with a force greater than the frictional force between the plate P and the substrate supporting apparatus 226 in order to move the plate P. For example, by using a tensile spring having a large spring constant as the tensile coil spring 74 of the substrate holding mechanism 70B, the substrate holding mechanism 70B can be employed as a substrate moving mechanism constituting the misplacement preventing apparatus. Moreover, the reference member constituting the misplacement preventing apparatus can be made up of two projected members arranged in predetermined intervals along the transversal sides of the frame 28.

Following is a description of the action of a substrate supporting apparatus comprising the misplacement preventing apparatus configured as described above, which is transferring a plate. First, the plate P is mounted on the substrate supporting apparatus by the plate loading/unloading apparatus (not shown in Figs.). At this stage, the plate P is not in contact with the reference member. The substrate supporting apparatus holding the plate P is then lifted by the transfer arm which causes the substrate moving mechanism to pressure the side opposite to the reference member. This causes the plate P to move toward the reference member and then stop at a position where the plate P makes contact with the reference member. Thus, the plate P is positioned at the predetermined position, that is, the substrate supporting apparatus can correct the position even when the plate P is placed at positions different from the predetermined position on the substrate supporting apparatus. When the positioning has been completed, the substrate moving mechanism completes its primary role, however, the substrate moving mechanism continues to pressure the plate P against the reference member to maintain the contact, so that the plate P is held in a stable state at the predetermined position. Thus, the substrate moving mechanism functions to prevent misplacement in cooperation with the reference member after having completed positioning.

The reference member may be of any shape or configuration as long as it is in contact with the edge of the plate and can prevent the misplacement thereof.

Furthermore, the misplacement preventing apparatus employs a fixed reference member in the description above, however, another misplacement preventing apparatus which has a movable reference member and the substrate moving mechanism as described above as a positioning function may be configured. In a substrate supporting apparatus comprising this other misplacement preventing apparatus, the reference member is provided so it may move in between the first and second movable ends near the edge of the substrate supporting apparatus. The reference member is pressured at all times toward the first movable end by a pressuring member such as a spring with a force smaller than a pressuring force (the force of the substrate moving mechanism for pressuring the plate P) of the substrate moving mechanism. The first movable end mentioned above, is the movement limit position of the reference member being pressured by the pressuring member, when the plate P is not in contact therewith. The second movable end is the movement limit position when the reference member is pressured via the plate P, which is pressed by the substrate moving mechanism.

Following is the action of the substrate supporting apparatus comprising the movable reference member while transferring a plate. First, the plate P is mounted on the substrate supporting apparatus by the plate loading/unloading apparatus (not shown in Figs.). As same as above, the plate P is then, not in contact with the reference member. The substrate supporting apparatus holding the plate P is thereinafter lifted by the transfer arm, which causes the substrate moving mechanism to press the plate P against the reference member located at the first movable end. When the plate P is brought into contact with the reference member located at the first movable end, the reference member is pressured by the substrate moving mechanism via the plate P against pressuring forces such as with a spring, moving toward the second movable end. Then, as the reference member reaches the second movable end, the reference member stops at a position, the plate P resulting to be positioned at the predetermined position. The substrate moving mechanism functions to prevent misplacement in cooperation with the reference member, similar to the previous descriptions.

With the substrate supporting apparatus comprising the misplacement preventing apparatus and the movable reference member, the movable reference member continues to be in contact with the plate P while moving from the first to the second movable end. Accordingly, the plate P is moved toward the predetermined position while being clasped by the movable reference member and the substrate moving mechanism. This provides a feature (merit) in which the plate P can be substantially positively prevented from being detached from the substrate supporting apparatus, even when an external force affects the plate P while the plate P is being moved. This also provides an effect to reduce the impact which occurs when the plate P is brought to the predetermined position, compared with the substrate supporting apparatus in which the reference member is fixed.

Furthermore, the holding pads 75 can be employed as the movable reference member described above, by using a spring with a predetermined spring constant as the tensile coil spring of the substrate moving mechanism.

In the descriptions above, the transfer arm lifts the substrate supporting apparatus, in short, the action of the weight of the substrate supporting apparatus itself is dissolved, causing the plate P to be pressed by the substrate holding mechanism or the substrate moving mechanism. The pressure affecting the plate P, is generated by using the pressured force of the spring, however, the present invention is not limited thereto. That is, such a configuration may be employed in which a pressuring force can be generated regardless of the presence of the action of the weight of the substrate supporting apparatus itself. As a source of generating a pressuring force in such a case, for example, an electric actuator or air cylinder may be employed, which can be arranged on the substrate supporting apparatus or externally arranged, and a substrate moving mechanism employing the force can pressure the plate P to move.

Furthermore, the plate P can be moved with a smaller force by reducing the friction between the plate P and the substrate supporting apparatus by air flow or the like.

It is also a matter of course, that rubber members can be used as elastic members instead of the tensile coil springs 74 that constitute the substrate holding mechanisms 70A–70D. The elastic force of the rubber members allows the plate P to be moved, or prevents the plate P from being misplaced.

In the third embodiment described above, the locust parallel motion mechanism, a type of the Scott Russell parallel motion mechanism, is employed as a link mechanism constituting the substrate holding mechanisms 70A–70D, however, the present invention is not limited thereto and may employ other link mechanisms. Any link mechanism can be employed, so long as it satisfies the condition that a part of the link constituting the link mechanism can be brought into contact with the edge of the plate P by the pressured force of an elastic member, such as a spring or rubber. The link mechanism should also satisfy the condition that the contact made by a part of the link above at the edge of the plate P, can be released by the action of the weight of the substrate supporting apparatus itself.

As described above in the third embodiment, the vacuum mechanism of the transfer arm as well as the vacuum mechanism of the substrate holder do not have to be arranged, so long as a positioning mechanism between the substrate supporting apparatus and the transfer arm, a positioning mechanism between the substrate supporting apparatus and the substrate holder, and a misplacement preventing portion between the substrate and the substrate supporting apparatus which also functions as a substrate holding mechanism, are arranged. In such a case, plate-shaped members with no opening portions to support the substrate supporting apparatus can be used. In this case, groove portions into which the supporting portions fit into need to be formed on the upper surface of the substrate holder.

The exposure apparatus 300 described in the third embodiment is manufactured through the following process. The substrate supporting apparatus 226 for supporting the plate P is prepared. Then, the robot 20 having a transfer arm 24 as a transfer member which holds the substrate supporting apparatus 226 and transfers it together with the plate P, is installed on the floor. An illumination optical system that comprises optical elements such as a plurality of lenses and the projection optical system PL are incorporated into the main body of the exposure apparatus that includes the base 12, and optical adjustment is carried out. The reticle stage and the plate stage PST, which are made up of a number of mechanical parts, are wired, piped and interconnected, are also installed in the main body. The holder 14', to mount the substrate supporting apparatus 226 is further prepared and incorporated into the plate stage PST, and then wired, piped and interconnected. Respective recessed portions and projected portions, which constitute the four sets of positioning units between the substrate supporting apparatus and the holder are arranged prior to incorporating the holder into the plate stage. Then, general adjustments (including electrical adjustments and operation verification) are finally made to the exposure apparatus. The exposure apparatus 300 is, thus manufactured. The manufacture of the exposure apparatus is preferably performed in a clean room, which is controlled in temperature, cleanliness or other parameters.

In the first, second, and third embodiment, the transfer arm 24 or 24' supports both sides of the substrate supporting apparatus 26, 126, or 226 from underneath, however, the present invention is not limited thereto. The substrate supporting apparatus may be supported from the front or from the front and the sides, so long as the plate P can be transferred safely.

The collar portions 27 of the frame 28 does not necessarily have to be arranged, and it is also possible to support part of the frame with the transfer arm 24 by making the frame 28 a little larger.

In each of the embodiments above, the substrate transfer apparatus and the method for holding substrates according to the present invention are applied to an exposure apparatus for liquid crystal display substrates employing the step and scan method. However, the present invention is not limited thereto, and can also be applied to an isometric full-transfer type scanning exposure apparatus for liquid crystal display substrates, which synchronously moves the mask and the substrate and sequentially transfers the mask pattern onto the substrate. It can also be applied to a step and repeat type exposure apparatus for liquid crystal display substrates, which transfers the mask pattern onto the substrate when the mask and the substrate are static, and moves the substrate step by step. The substrate transfer apparatus and the method for exchanging a substrate related to the present invention, can also be applied to a proximity exposure apparatus, in which the pattern of the mask is transferred onto the substrate without using a projection optical system. In this exposure, the mask and substrate is proximate to each other.

In addition, the usage of exposure apparatus is not limited to those for manufacturing liquid crystal display substrates, and the exposure apparatus may also be used in manufacturing semiconductor devices to transfer integrated circuit patterns onto wafers, or in manufacturing thin magnetic-film heads. The substrate supporting apparatus, the substrate transfer apparatus, and the method for exchanging a substrate related to the present invention is not limited only to exposure apparatus. The present invention can be widely applied also to substrate processing apparatus, such as a substrate inspection apparatus so long as the apparatus has a substrate holder for holding a substrate.

The energy beam used for exposure in the present invention, is not limited to the DUV light such as g-line (436 nm), i-line (365 nm) and KrF excimer laser light (248 nm), and can be charged particle beams such as ArF excimer laser light (193 nm), $F_2$ laser light (157 nm), X-ray, or electron beams. In the case electron beams are used, lanthanum hexaborite ($LaB_6$) or tantalum (Ta), which emits thermal electrons, can be used as an electron gun.

In addition, the projection optical system of the exposure apparatus according to the present invention may employ not only an isometric system but also a reduction magnification system or an enlargement magnification system.

As the projection optical system, glass materials such as crystal or fluorite that transmits far ultraviolet-light are used, when far ultraviolet-light such as excimer laser light is used. In the case when $F_2$ laser light or X-ray is used, a reflection refraction system or a reflection system is used as the optical system (the reticle is also a reflective type). In the case when an electron beam is used, an electron optical system comprising electron lenses and deflectors can be used as the optical system, and the optical path through which electron beams pass is, naturally, of a vacuumed state. In the electron beam exposure apparatus employing such electron optical system, the process for incorporating the mask stage as described earlier in the process of manufacturing the exposure apparatus is not required, since masks are not used or are incorporated in advance in the electron lens-barrel.

As described above, the substrate supporting apparatus according to the present invention is advantageous for transferring substrates, and in particular, for transferring large substrates. The substrate transfer apparatus and the method for transferring substrates according to the present invention are also advantageous for transferring a substrate onto a substrate holder. In particular, they are advantageous for transferring substrates onto the substrate holder when only a narrow space is available at the surface of the substrate holder where the substrate is placed. Furthermore, the method for exchanging a substrate according to the present invention is advantageous for exchanging a substrate on the substrate holder and in particular for exchanging large substrates. Still furthermore, the exposure apparatus according to the present invention is advantageous for manufacturing liquid crystal display devices and semiconductor devices and the like, being suitable for reducing the time required to exchange a substrate and thus improving the productivity of liquid crystal display devices or the like.

While the above-described embodiments of the present invention are the presently preferred embodiments thereof, those skilled in the art of lithography systems will readily recognize that numerous additions, modifications and substitutions may be made to the above-described embodiments without departing from the spirit and scope thereof. It is intended that all such modifications, additions and substitutions fall within the scope of the present invention, which is best defined by the claims appended below.

What is claimed is:

1. A method for holding a substrate on a substrate holder, comprising:
    preparing a substrate supporting apparatus which has a support portion and an opening portion having a plurality of openings smaller than said substrate to support said substrate; and
    integrally holding said substrate and said substrate supporting apparatus by said substrate holder, said substrate holder having a housing portion which houses at least a portion of said support portion.

2. The method according to claim 1, wherein an area of said supporting portion is smaller than an area of said plurality of openings.

3. The method according to claim 1, wherein said substrate holder holds said substrate on a substrate mount surface and holds said substrate supporting apparatus below said substrate mount surface.

4. A substrate transfer method for loading a substrate onto a substrate mount surface of a holder which holds said substrate, comprising:
    preparing a substrate supporting apparatus and a loading member;
    transferring said substrate supporting apparatus supporting said substrate by said loading member to said holder; and
    holding said substrate supporting apparatus by said holder when said substrate is held onto said substrate mount surface.

5. The substrate transfer method according to claim 4, wherein said substrate supporting apparatus comprises a supporting portion and an opening portion having a plurality of openings smaller than said substrate to support said substrate.

6. The substrate transfer method according to claim 5, wherein an area of said supporting portion is smaller than an area of said plurality of openings.

7. The substrate transfer method according to claim 4, wherein said substrate holder holds said substrate supporting apparatus below said substrate mount surface.

8. A substrate transfer method for unloading a processed substrate from a substrate mount surface of a holder which holds said substrate, comprising:
    preparing a substrate supporting apparatus which has a support portion and an opening portion having a plurality of openings smaller than said substrate to support said substrate, and an unloading member;
    holding said substrate supporting apparatus by said holder when said substrate is held onto said substrate mount surface;
    engaging said unloading member with said substrate supporting apparatus mounted with said substrate, mounted on said substrate mount surface; and
    detaching said substrate from said substrate mount surface after said substrate supporting apparatus supports said substrate, by driving said unloading member into a predetermined direction.

9. The substrate transfer method according to claim 8, wherein an area of said supporting portion is smaller than an area of said plurality of openings.

10. The substrate transfer method according to claim 8, wherein said substrate holder holds said substrate supporting apparatus below said substrate mount surface.

11. The substrate transfer method according to claim 4, further comprising:
    pressuring at least one edge of said substrate to position said substrate in respect to said substrate supporting apparatus, upon transferring said transfer supporting apparatus onto said substrate mount surface by said loading member.

12. The method for holding a substrate according to claim 1, wherein said housing portion has groove portions to house said substrate supporting apparatus.

13. The method for holding a substrate according to claim 1, wherein said substrate is suctioned after said substrate holder integrally holds said substrate and said substrate supporting apparatus.

* * * * *